United States Patent
Takechi et al.

(10) Patent No.: US 8,232,124 B2
(45) Date of Patent: Jul. 31, 2012

(54) THIN-FILM TRANSISTOR ARRAY, METHOD OF FABRICATING THE SAME, AND LIQUID CRYSTAL DISPLAY DEVICE INCLUDING THE SAME

(75) Inventors: Kazushige Takechi, Tokyo (JP); Mitsuru Nakata, Kanagawa (JP)

(73) Assignees: NEC Corporation, Tokyo (JP); NLT Technologies, Ltd., Kanagawa (JP)

( * ) Notice: Subject to any disclaimer, the term of this patent is extended or adjusted under 35 U.S.C. 154(b) by 76 days.

(21) Appl. No.: 12/868,418

(22) Filed: Aug. 25, 2010

(65) Prior Publication Data
US 2010/0320471 A1    Dec. 23, 2010

Related U.S. Application Data

(62) Division of application No. 11/890,677, filed on Aug. 7, 2007, now Pat. No. 7,804,091.

(30) Foreign Application Priority Data

Aug. 9, 2006 (JP) ................................ 2006-217273

(51) Int. Cl.
*H01L 21/00* (2006.01)
(52) U.S. Cl. ................ 438/34; 257/72; 257/59; 349/42; 349/43; 349/46; 438/30
(58) Field of Classification Search .................... 349/42, 349/43, 46; 257/59, 72; 438/30, 34
See application file for complete search history.

(56) References Cited

U.S. PATENT DOCUMENTS

| 6,038,003 | A | 3/2000 | Kim |
| 7,923,274 | B2 * | 4/2011 | Yagi et al. ........................ 438/30 |
| 2002/0056838 | A1 | 5/2002 | Ogawa |
| 2004/0142118 | A1 | 7/2004 | Takechi |
| 2005/0092990 | A1 | 5/2005 | Yoo et al. |
| 2005/0199960 | A1 | 9/2005 | Hoffman et al. |

FOREIGN PATENT DOCUMENTS

| JP | 10-31227 | 2/1998 |
| JP | 2003-50405 | 2/2003 |

* cited by examiner

*Primary Examiner* — Nathan Ha
*Assistant Examiner* — Yu-Hsi Sun
(74) *Attorney, Agent, or Firm* — Scully, Scott, Murphy & Presser, P.C.

(57) ABSTRACT

A thin-film transistor array includes an electrically insulating substrate, a plurality of thin-film transistors arranged in a matrix on the substrate, and each including a channel, a source, and a drain each comprised of an oxide-semiconductor film, a pixel electrode integrally formed with the drain, a source signal line through which a source signal is transmitted to a group of thin-film transistors, a gate signal line through which a gate signal is transmitted to a group of thin-film transistors, a source terminal formed at an end of the source signal line, and a gate terminal formed at an end of the gate signal line. The source terminal and the gate terminal are formed in the same layer as a layer in which the channel is formed. The source terminal and the gate terminal have the same electric conductivity as that of the pixel electrode.

19 Claims, 17 Drawing Sheets

THIN-FILM TRANSISTOR ARRAY, METHOD OF FABRICATING THE SAME, AND LIQUID CRYSTAL DISPLAY DEVICE INCLUDING THE SAME

RELATED APPLICATION

This application is a divisional of U.S. Ser. No. 11/890,677, filed Aug. 7, 2007, the entire contents of which are incorporated herein by reference.

BACKGROUND OF THE INVENTION

1. Field of the Invention

The invention relates to a thin-film transistor array, a method of fabricating the same, and a liquid crystal display device including the same.

2. Description of the Related Art

A transparent electrically conductive film composed of oxide, such as an ITO film composed of compound of indium (In), tin (Sn), and oxygen (O), is frequently used in a flat panel display or a photoelectric transfer device, since it has a sheet resistance of a few ohms per a unit area even if it has a small thickness such as hundreds of nanometers, and it has high transmittance to visible light.

Furthermore, a study to a thin-film transistor including a channel layer composed of transparent oxide semiconductor such as In—Ga—Zn—O has been recently started.

Such oxide semiconductor contains highly ionic bonds, and is characterized by a small difference in electron mobility between crystalline state and amorphous state.

Accordingly, relatively high electron mobility can be obtained even in amorphous state.

Since an amorphous film of oxide semiconductor can be formed at room temperature by carrying out sputtering, a study about a thin-film transistor composed of oxide semiconductor to be formed on a resin substrate such as a PET substrate has been started.

For instance, Japanese Patent Application Publication No. 2003-50405 has suggested a thin-film transistor array including an oxide-semiconductor film formed on a substrate. By applying electrical conductivity to a certain part of the oxide-semiconductor film, there are formed a channel, a source, and a drain of a thin-film transistor, and there are further formed an electrically conductive part including a pixel electrode electrically connected to the drain.

In the above-mentioned thin-film transistor array, a part composed of intrinsic oxide-semiconductor containing no impurities defines a channel of a thin-film transistor, and an electrically conductive part into which impurities were doped defines both a source and a drain of a thin-film transistor, and a pixel electrode.

However, the above-mentioned thin-film transistor array is accompanied with a problem that it is unavoidable for a number of carrying out a photolithography step to increase, since an electrically conductive part is formed by doping impurities thereinto through the use of a photomask.

Furthermore, the above-mentioned Publication is silent about a signal line terminal through which a thin-film transistor is electrically connected to an external drive circuit.

Accordingly, there is not accomplished so far a thin-film transistor array composed of oxide semiconductor, which is capable of ensuring electrical connection between a signal line terminal and an external driver circuit without an increase in a number of carrying out a photolithography step.

Japanese Patent Application Publication No. 10-31227 (published on February 1998) has suggested a thin-film transistor array substrate including a plurality of display units each comprised of a top gate type thin-film transistor, and a pixel electrode electrically connected to a drain electrode. A source electrode, a drain electrode, a pixel electrode, a signal line, a signal line terminal, and a scanning line terminal are comprised commonly of a transparent electrically conductive film. The transparent electrically conductive film is exposed outside at both the signal line terminal and the scanning line terminal through a terminal contact hole. A refractive metal film is formed at a boundary between portions of the transparent electrically conductive film located at the signal line terminal and the scanning line terminal, and an inner wall of a contact hole formed throughout an electrically insulating film. The refractive film is covered with an inorganic electrically insulating film.

SUMMARY OF THE INVENTION

In view of the above-mentioned problem in the related art, it is an exemplary object of the present invention to provide a thin-film transistor array which is capable of enhancing reliability in electrical connection with an external driver circuit, and being fabricated in accordance with a low-cost process without an increase in a number of carrying out a photolithography step.

It is also an exemplary object of the present invention to provide a method of fabricating the above-mentioned thin-film transistor array.

It is also an exemplary object of the present invention to provide a liquid crystal display device including the above-mentioned thin-film transistor array.

In a first exemplary aspect of the present invention, there is provided a thin-film transistor array including an electrically insulating substrate, a plurality of thin-film transistors arranged in a matrix on the electrically insulating substrate, and each including a channel, a source, and a drain each comprised of an oxide-semiconductor film, a pixel electrode integrally formed with the drain, a source signal line through which a source signal is transmitted to a group of thin-film transistors among the plurality of thin-film transistors, a gate signal line through which a gate signal is transmitted to a group of thin-film transistors among the plurality of thin-film transistors, a source terminal formed at an end of the source signal line, and a gate terminal formed at an end of the gate signal line, the source terminal and the gate terminal being formed in the same layer as a layer in which the channel is formed, the source terminal and the gate terminal having the same electric conductivity as that of the pixel electrode.

There is further provided a thin-film transistor array including an electrically insulating substrate, a plurality of thin-film transistors arranged in a matrix on the electrically insulating substrate, and each including a channel, a source and a drain each comprised of an oxide-semiconductor film, a pixel electrode integrally formed with the drain, a source signal line through which a source signal is transmitted to thin-film transistors located on a common column, a gate signal line through which a gate signal is transmitted to thin-film transistors located on a common row, a source terminal formed at an end of the source signal line, and a gate terminal formed at an end of the gate signal line, the pixel electrode, the source terminal and the gate terminal being comprised of an oxide-semiconductor film composed of oxide semiconductor which is identical with oxide semiconductor of which the oxide-semiconductor film defining the channel and the source and drain is composed.

When such a thin-film transistor array as mentioned above is actually driven, a source of a thin-film transistor turns into a drain and a drain of a thin-film transistor turns into a source in dependence on a timing at which a pulse voltage is applied to the thin-film transistor. In other words, a part which acted as a source at an instance acts as a drain at a next instance, and in contrast, a part which acted as a drain at an instance acts as a source at a next instance. Accordingly, a part defined as a source signal line or a source in the specification may be read as a drain signal line or a drain, respectively, and vice versa.

In the thin-film transistor array in accordance with the present invention, a source terminal, a gate terminal, a pixel electrode, and a channel of a thin-film transistor are formed in a common layer, and the source terminal and the gate terminal have the same electric conductivity as that of the pixel electrode. In order to accomplish the above-mentioned structure of the thin-film transistor array, there are simultaneously formed thin films from which a source terminal, a gate terminal, a pixel electrode, and a channel of a thin-film transistor will be formed. Then, the thin films are patterned into a source terminal, a gate terminal, a pixel electrode, and a channel of a thin-film transistor. Then, an electrically insulating film is formed so as to cover them therewith. Then, the electrically insulating film is patterned such that the electrically insulating film exists only above the channel, and only the source terminal, the gate terminal, and the pixel electrode are exposed to reducing plasma. Thus, the above-mentioned structure of the thin-film transistor array can be obtained.

The exposure to reducing plasma reduces an electrical conductivity of oxide semiconductor of which the source terminal, the gate terminal and the pixel electrode are composed, and accomplishes desired electric contact between the source and gate terminals and an external circuit terminal, that is, a small contact resistance between the same. Since oxide semiconductor of which the channel of a thin-film transistor is composed is not exposed to reducing plasma, the oxide semiconductor can keep a desired electrical conductivity required as a semiconductor. If the channel is exposed to reducing plasma, the channel would have a reduced electrical conductivity, resulting in that a drain off current of a thin-film transistor increases, and accordingly, it is not possible to keep a desired an ON/OFF ratio.

In a second exemplary aspect of the present invention, there is provided a method of fabricating a thin-film transistor array, including forming an oxide-semiconductor film, patterning the oxide-semiconductor film into a channel, a source and a drain of a thin-film transistor, a pixel electrode, a gate terminal, and a source terminal, and exposing at least a part of each of the source, the drain, the pixel electrode, the source terminal, and the gate terminal to one of reducing plasma and plasma containing at least one of B, Al, Ga, In and F for reducing a resistivity of the part.

There is further provided a method of fabricating a thin-film transistor array, including forming an oxide-semiconductor film, patterning the oxide-semiconductor film into a channel, a source and a drain of a thin-film transistor, a pixel electrode, a gate terminal, and a source terminal, and doping at least one of B, Al, Ga, In and F into at least a part of each of the source, the drain, the pixel electrode, the source terminal, and the gate terminal for reducing a resistivity of the part.

There is still further provided a method of fabricating a thin-film transistor array, including, in sequence, forming a first electrically conductive film on an electrically insulating substrate, patterning the first electrically conductive film into a gate signal line, forming a gate insulating film, etching for removal a portion of the gate insulating film located above a portion of the gate signal line to thereby form a gate terminal contact hole, forming an oxide-semiconductor film, patterning the oxide-semiconductor film into a channel, a source and a drain of a thin-film transistor, a pixel electrode, a gate terminal located above the gate terminal contact hole, and a source terminal, forming a second electrically conductive film, patterning the second electrically conductive film into a source signal line electrically connected to the source terminal, forming a protection insulating film, etching for removal portions of the protection insulating film located above the gate terminal, the source terminal, the source, the drain, and the pixel electrode to thereby form a gate/source terminal contact hole and an opening, and exposing a resultant to one of reducing plasma and plasma containing at least one of B, Al, Ga, In and F.

There is yet further provided a method of fabricating a thin-film transistor array, including, in sequence, forming a first electrically conductive film on an electrically insulating substrate, patterning the electrically conductive film into a gate signal line, forming a gate insulating film, forming a second electrically conductive film, patterning the second electrically conductive film into a source signal line, etching for removal a portion of the gate insulating film located above a portion of the gate signal line to thereby form a gate terminal contact hole, forming an oxide-semiconductor film, patterning the oxide-semiconductor film into a channel, a source and a drain of a thin-film transistor, a pixel electrode, a gate terminal located above the gate terminal contact hole, and a source terminal located at an end of the source signal line, forming a protection insulating film, etching for removal portions of the protection insulating film located above the gate terminal, the source terminal, the source, the drain, and the pixel electrode to thereby form a gate/source terminal contact hole and an opening, and exposing a resultant to one of reducing plasma and plasma containing at least one of B, Al, Ga, In and F.

There is further provided a method of fabricating a thin-film transistor array, including, in sequence, forming an oxide-semiconductor film on an electrically insulating substrate, patterning the oxide-semiconductor film into a channel, a source and a drain of a thin-film transistor, a pixel electrode, a gate terminal, and a source terminal, forming a gate insulating film, etching for removal a portion of the gate insulating film located above a portion of the gate signal line to thereby form a gate terminal contact hole, forming a first electrically conductive film, patterning the first electrically conductive film into a gate signal line electrically connected to the gate terminal, forming an interlayer insulating film, etching for removal portions of the interlayer insulating film and the gate insulating film located the source terminal and the source to thereby form a source terminal contact hole and a source contact hole, forming a second electrically conductive film, patterning the second electrically conductive film into a source signal line electrically connected to the source terminal and the source, forming a protection insulating film, etching for removal portions of the gate insulating film, the interlayer insulating film and the gate insulating film located above the gate terminal, the source terminal, the source, the drain and the pixel electrode to thereby form a gate/source terminal contact hole and an opening, and exposing a resultant to one of reducing plasma and plasma containing at least one of B, Al, Ga, In and F.

There is further provided a method of fabricating a thin-film transistor array, including, in sequence, forming a first electrically conductive film on an electrically insulating substrate, patterning the first electrically conductive film into a source signal line, forming an oxide-semiconductor film, patterning the oxide-semiconductor film into a channel, a source and a drain of a thin-film transistor, a pixel electrode, a gate terminal, and a source terminal, forming a gate insulating film, etching for removal a portion of the gate insulating film located above a portion of the gate signal line to thereby form a gate terminal contact hole, forming a second electrically conductive film, patterning the second electrically conductive film into a gate signal line electrically connected to the gate terminal, forming a protection insulating film, etching for removal portions of the protection insulating film and the gate insulating film located above the gate terminal, the source terminal, the source, the drain and the pixel electrode to thereby form a gate/source terminal contact hole and an opening, and exposing a resultant to one of reducing plasma and plasma containing at least one of B, Al, Ga, In and F.

In a third exemplary aspect of the present invention, there is provided a liquid crystal display device including either the above-mentioned thin-film transistor array or a thin-film transistor array fabricated in accordance with one of the above-mentioned method.

The above and other objects and advantageous features of the present invention will be made apparent from the following description made with reference to the accompanying drawings, in which like reference characters designate the same or similar parts throughout the drawings.

DESCRIPTION OF THE EXEMPLARY EMBODIMENTS

Exemplary embodiments in accordance with the present invention will be explained hereinbelow with reference to drawings.

First Exemplary Embodiment

Figure 1A:
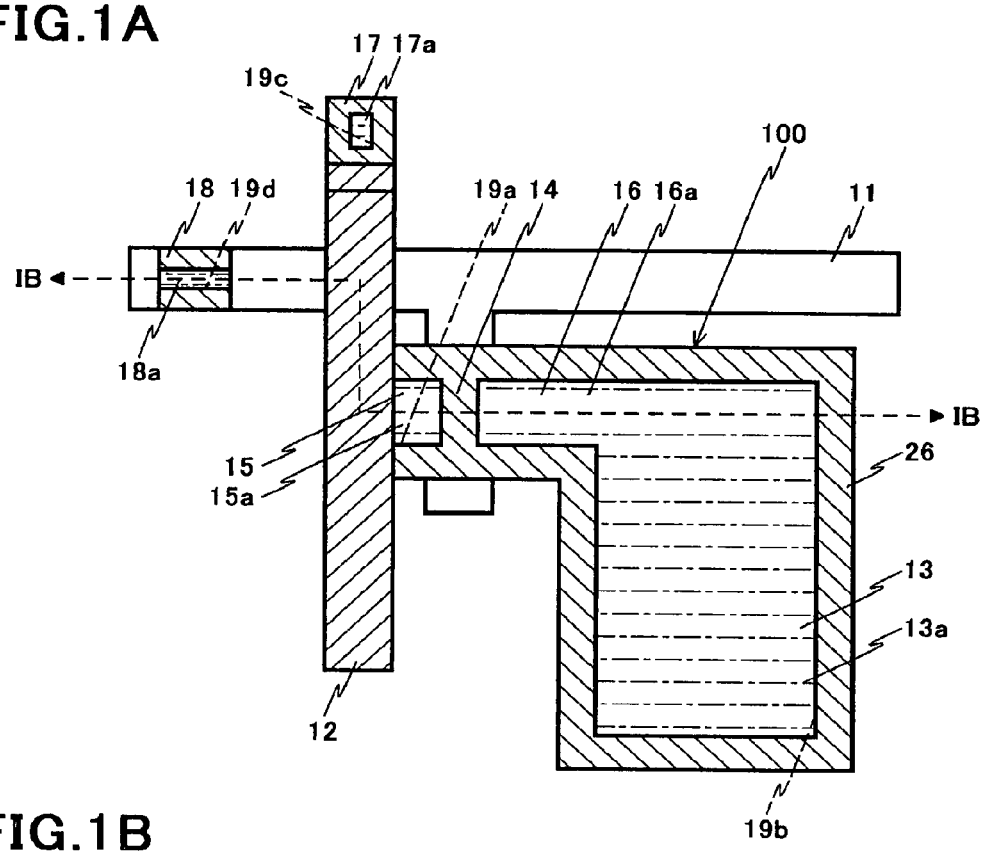
FIG. 1A is a plain view of a thin-film transistor array in accordance with the first exemplary embodiment.
Figure 1B:
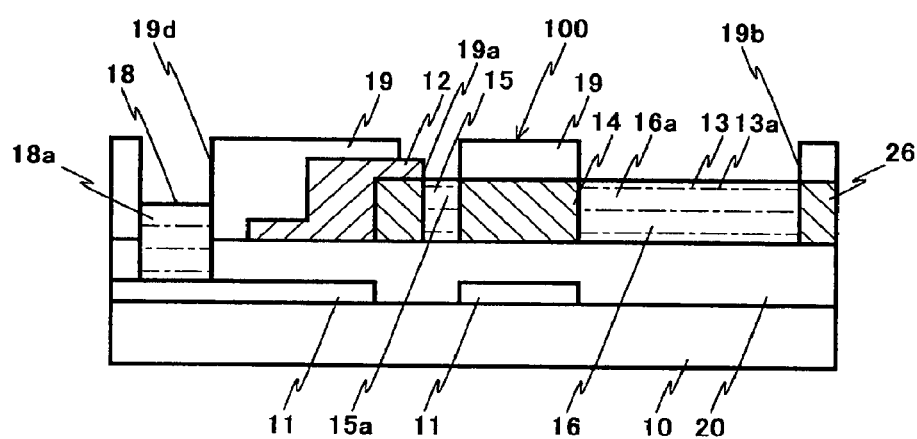
FIG. 1B is a cross-sectional view taken along the line IB-IB in FIG. 1A.

FIG. 1A is a plain view of a thin-film transistor array in accordance with the first exemplary embodiment, and FIG. 1B is a cross-sectional view taken along the line IB-IB in FIG. 1A.

The thin-film transistor array in accordance with the first exemplary embodiment is a bottom gate stagger type thin-film transistor array.

The thin-film transistor array in accordance with the first exemplary embodiment is designed to include a plurality of thin-film transistors 100 arranged in a matrix on an electrically insulating substrate 10, that is, the thin-film transistors 100 are arranged on the electrically insulating substrate 10 in both a column direction (for instance, an up-down direction in FIG. 1A) and a row direction which is perpendicular to the column direction in a plane in which the column direction lies (for instance, a left-right direction in FIG. 1A).

For simplification, FIGS. 1A and 1B illustrate only one thin-film transistor 100 and a structure existing around the thin-film transistor 100.

The thin-film transistors 100 are arranged in a matrix on the electrically insulating substrate 10, and each of the thin-film transistors 100 includes a channel 14, a source 15, and a drain 16 all comprised of an oxide-semiconductor film.

The thin-film transistor array further includes a pixel electrode 13 integrally formed with the drain 16 of the thin-film transistor 100, a source signal line 12 arranged for every column of the thin-film transistors 100, a gate signal line 11 arranged for every row of the thin-film transistors 100, a source terminal 17 formed at an end of the source signal line 12, and a gate terminal 18 formed at an end of the gate signal line 11.

The source signal line 12 extends in a column direction (that is, an up-down direction in FIG. 1A). A source signal is supplied to the thin-film transistors 100 located on a common column, through the source signal line 12.

The gate signal line 11 extends in a row direction (that is, a left-right direction in FIG. 1A). A gate signal is supplied to the thin-film transistors 100 located on a common row, through the gate signal line 11.

Each of the pixel electrode 13, the source terminal 17, and the gate terminal 18 is comprised of an oxide-semiconductor film.

Both the thin-film transistor 100 including the channel 14, the source 15, and the drain 16, and the pixel electrode 13 are located in the vicinity of an intersection at which the gate signal line 11 and the source signal line 12 intersect with each other.

The channel 14, the source 15, and the drain 16 of the thin-film transistor 100, the pixel electrode 13, the source terminal 17, and the gate terminal 18 are comprised of a common oxide-semiconductor film 26.

By composing the source terminal 17 and the gate terminal 18 of oxide semiconductor (that is, the oxide-semiconductor film 26), it is possible to significantly enhance reliability in electrical connection with an external driver circuit.

A low-resistivity area 15a defined as at least a part of the source 15, a low-resistivity area 16a defined as at least a part of the drain 16, a low-resistivity area 13a defined as at least a part of the pixel electrode 13, a low-resistivity area 17a defined as at least a part of the source terminal 17, and a low-resistivity area 18a defined as at least a part of the gate terminal 18 have a resistivity equal to or greater than $1/10^{10}$, but equal to or smaller than $1/10^2$ of a resistivity of the channel 14 in equilibrium state in which no voltage is applied to the channel 14.

The low-resistivity areas 15a, 16a, 13a, 17a and 18a can be formed by forming openings 19a, 19b, 19c and 19d at predetermined locations (that is, locations above the low-resistivity areas 15a, 16a, 13a, 17a and 18a illustrated in FIG. 1A) in a topmost layer, that is, a protection insulating film 19 (see FIG. 1B) after all of layer structure in the thin-film transistor array has been formed, and exposing the oxide-semiconductor film 26 to reducing plasma or plasma containing doping element(s) therein through the openings 19a, 19b, 19c and 19d.

An electrical conductivity of an oxide-semiconductor film is sensitive to a density of oxygen in the oxide-semiconductor film. This is because oxygen holes existing in the oxide-semiconductor film act as electron donors.

Herein, an effect caused when zinc oxide (ZnO) which is one of oxide semiconductors is exposed to argon (Ar) plasma which is one of reducing plasmas is considered.

When zinc oxide (ZnO) which is stable because outermost-shell valence electrons in zinc transfer into an outermost shell in oxygen, and accordingly, zinc and oxygen have closed-shell structure, is exposed at a surface thereof to positive ions of argon (Ar) existing in argon plasma, a part of outermost-shell electrons in oxygen are absorbed into positive ions of argon (Ar), and accordingly, oxygen and argon ions are electrically neutralized. The thus electrically neutralized oxygen combines with oxygen having been neutralized in the vicinity thereof, into an oxygen molecule. The thus generated oxygen molecule leaves ZnO. At that time, electrons staying in oxygen holes in ZnO act as a semiconductor carrier.

Accordingly, by controlling discharge power used for generating argon plasma to thereby control a density of argon ions, it is possible to control a density of carriers existing in an oxide-semiconductor film accordingly.

Specifically, it is possible to increase a density of argon ions by increasing discharge power used for generating argon plasma. Thus, it is possible to reduce an electrical conductivity of oxide semiconductor by exposing the oxide semiconductor to plasma.

As mentioned above, it is possible to control a concentration of oxygen holes existing in oxide semiconductor, that is, an electrical conductivity of oxide semiconductor, by controlling reducing plasma. A part to be exposed to reducing plasma is just a surface of an oxide-semiconductor film. It is not always necessary to expose an oxide-semiconductor film over a full thickness thereof to reducing plasma.

Furthermore, it is not necessary to expose an oxide-semiconductor film to a high-temperature process, because a concentration of oxygen holes existing in an oxide-semiconductor film can be controlled merely by exposing an oxide-semiconductor film to plasma. Thus, it is possible to use a resin substrate to which a high-temperature process cannot be applied.

Since the opening 19b among the openings 19a, 19b, 19c and 19d formed at the protection insulating film 19 is located above the drain 16 and pixel electrode 13 located adjacent to each other, the opening 19b is used as a common opening for the drain 16 and pixel electrode 13.

In the first exemplary embodiment, a contact part at which the oxide-semiconductor film makes contact with the drain electrode remains high-resistive, because it is not possible to expose a part located below the drain electrode to reducing plasma.

The opening 19c located above the source terminal 17 acts also as a source terminal contact hole, and the opening 19d located above the gate terminal 18 acts also as a gate terminal contact hole.

In the thin-film transistor array in accordance with the first exemplary embodiment, the oxide-semiconductor film 26 is exposed to reducing plasma or plasma containing doping element(s) through the openings 19a, 19b, 19c, and 19d to thereby simultaneously render the areas 18a, 17a, 15a, 16a, and 13a low-resistive. Thus, it is possible to fabricate a thin-film transistor array in accordance with a low-cost process.

Hereinbelow is explained a method of the thin-film transistor array in accordance with the first exemplary embodiment, with reference to FIGS. 2A to 5B.

FIGS. 2A, 3A, 4A and 5A are plain views showing respective steps to be carried out in a method of fabricating the thin-film transistor array illustrated in FIGS. 1A and 1B, and FIGS. 2B, 3B, 4B and 5B are cross-sectional views taken along the lines IIB-IIB, IIIB-IIIB, IVB-IVB, and VB-VB, respectively.

Figure 2A:
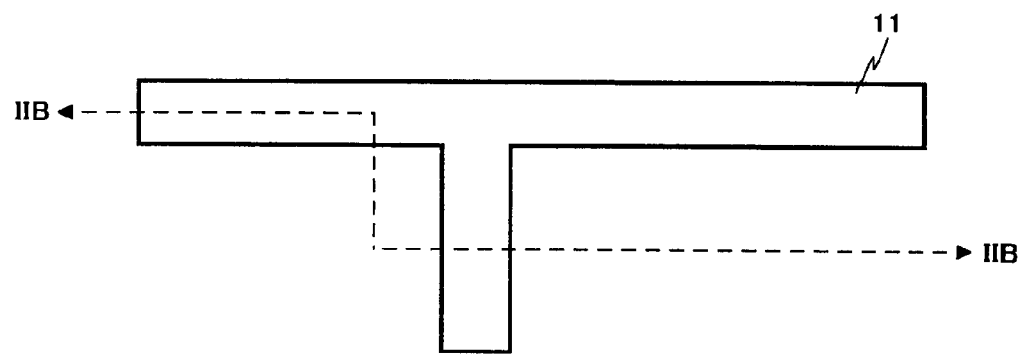
FIG. 2A is a plain view of a thin-film transistor array in accordance with the first exemplary embodiment.
Figure 2B:
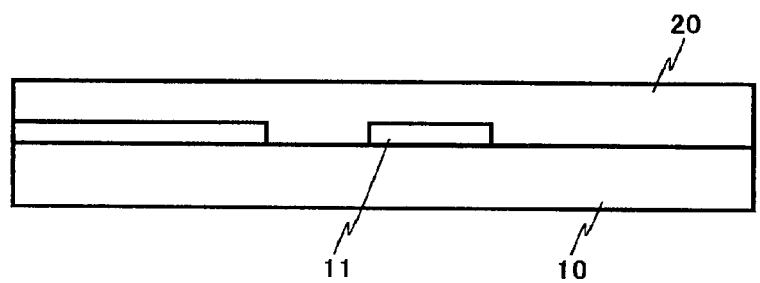
FIG. 2B is a cross-sectional view taken along the line IIB-IIB in FIG. 2A.

First, as illustrated in FIGS. 2A and 2B, a gate metal film (defined as "an electrically conductive film" in claims) is formed on the electrically insulating substrate 10. For instance, the gate metal film is composed of chromium (Cr), and is formed by sputtering on the electrically insulating substrate 10. The electrically insulating substrate 10 is comprised of a resin substrate, for instance.

Then, the gate metal film is patterned into the gate signal line 11.

Then, as illustrated in FIG. 2B, a gate insulating film 20 is formed on the electrically insulating substrate 10 such that the gate signal line 11 is completely covered with the gate insulating film 20. For instance, the gate insulating film 20 is composed of silicon nitride, and is formed by sputtering on the electrically insulating substrate 10. The gate insulating film 20 has a thickness of about 300 nanometers, for instance.

Figure 3A:
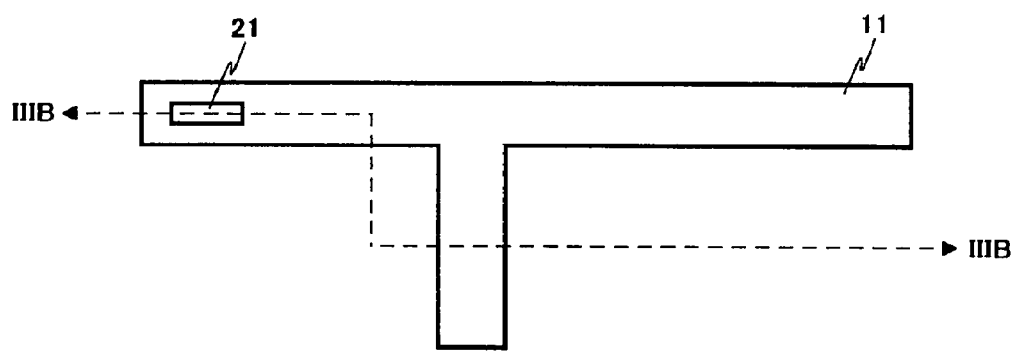
FIG. 3A is a plain view of a thin-film transistor array in accordance with the first exemplary embodiment.
Figure 3B:
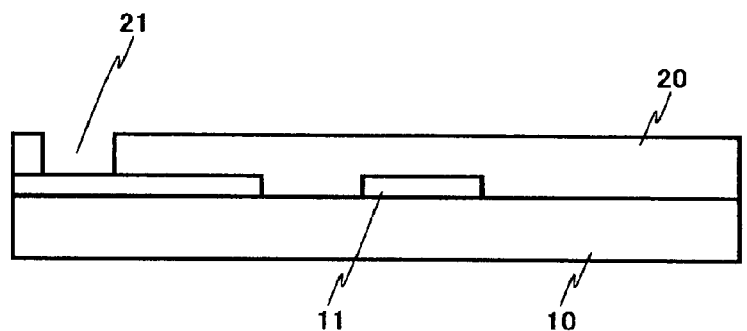
FIG. 3B is a cross-sectional view taken along the line IIIB-IIIB in FIG. 3A.

Then, as illustrated in FIGS. 3A and 3B, a portion of the gate insulating film 20 located above an end of the gate signal line 11 is etched for removal to thereby form a gate terminal contact hole 21 having a desired shape.

Then, the gate insulating film 20 is exposed at a surface thereof to oxygen plasma to thereby oxidize the surface of the gate insulating film 20.

Then, a transparent oxide-semiconductor film 26 is successively formed on the gate insulating film 20 by sputtering at room temperature without exposing to atmosphere. For instance, the transparent oxide-semiconductor film 26 is composed of $InGaZnO_4$.

Figure 4A:
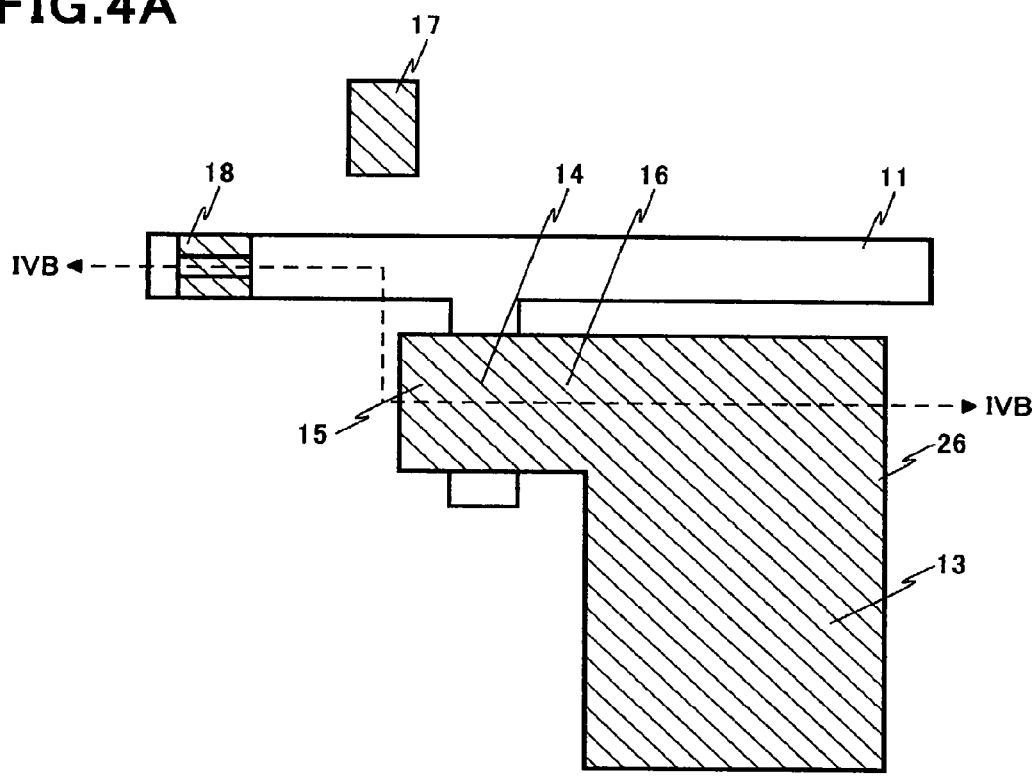
FIG. 4A is a plain view of a thin-film transistor array in accordance with the first exemplary embodiment.
Figure 4B:
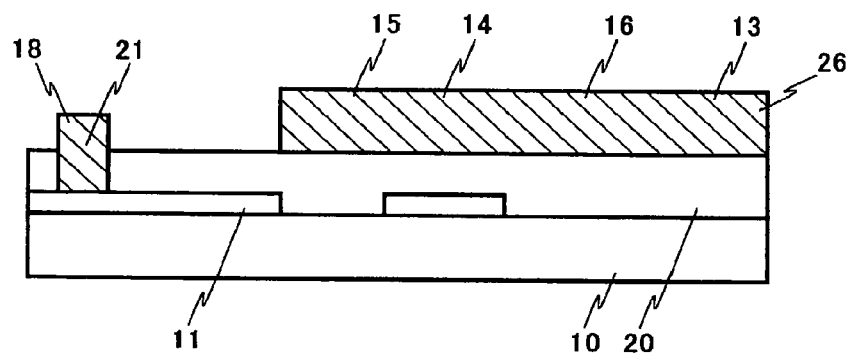
FIG. 4B is a cross-sectional view taken along the line IVB-IVB in FIG. 4A.

Since a portion of the gate insulating film 20 located above an end of the gate signal line 11 was etched for removal for forming the gate terminal contact hole 21, the oxide-semiconductor film 26 is formed further on an end of the gate signal line 11, as illustrated in FIGS. 4A and 4B.

Then, as illustrated in FIGS. 4A and 4B, the oxide-semiconductor film 26 is patterned into islands. As a result, there are formed the channel 14, the source 15, and the drain 16 of the thin-film transistor 100, the pixel electrode 13, the gate terminal 18 located above the gate terminal contact hole 21, and the source terminal 17. Thus, the channel 14, the source 15, and the drain 16 of the thin-film transistor 100, the pixel electrode 13, the gate terminal 18 located above the gate terminal contact hole 21, and the source terminal 17 are formed in a common layer, and are composed of a common material.

The reason why not only the channel 14, the source 15 and the drain 16 defining main parts of a thin-film transistor, but also the pixel electrode 13, the gate terminal 18 and the source terminal 17 can be formed by islands of the oxide-semiconductor film 26 is that the oxide-semiconductor film 26 is almost transparent to visible lights, and that since the oxide-semiconductor film 26 has characteristics analogous to those of an ITO film, the oxide-semiconductor film 26 can easily have desired electrical contact with a metal film.

Then, a resultant illustrated in FIGS. 4A and 4B is exposed to hydrogen plasma as a reducing step.

Then, a source metal film (defined as an electrically conductive film in claims) is formed over the gate insulating film 20 and the oxide-semiconductor film 26. The source metal film is composed of chromium (Cr), for instance.

Figure 5A:
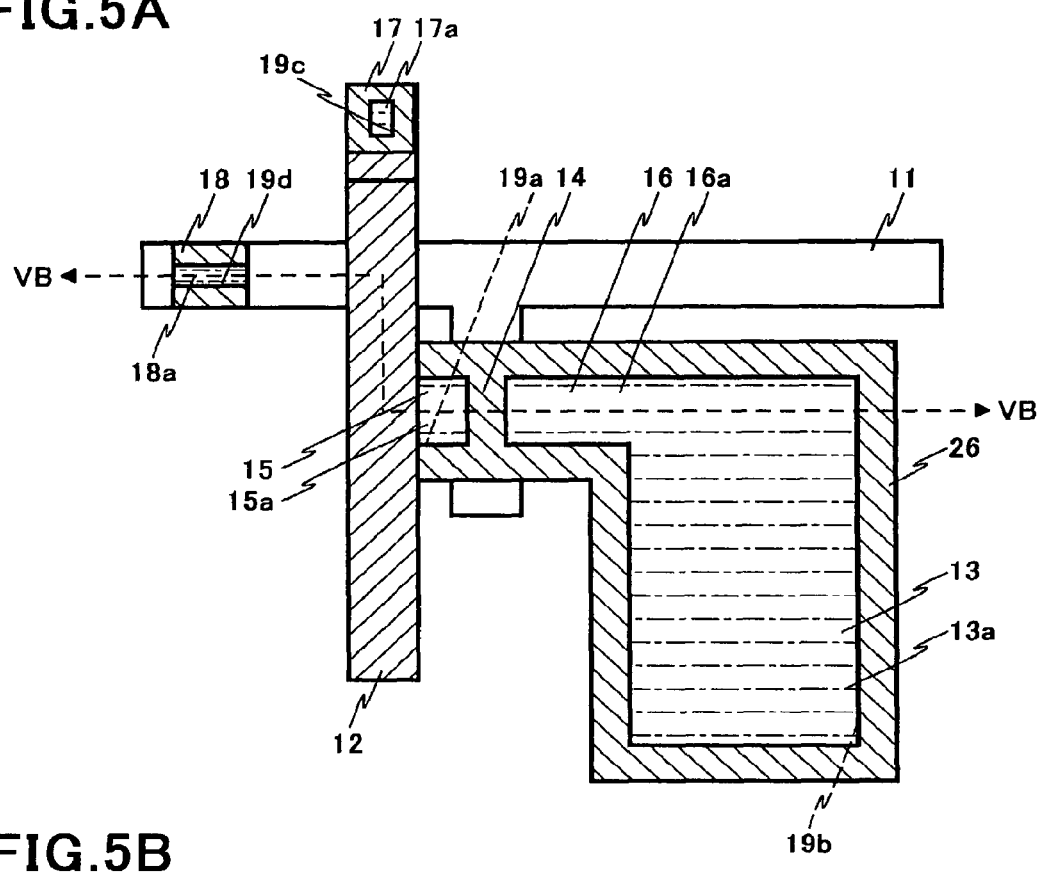
FIG. 5A is a plain view of a thin-film transistor array in accordance with the first exemplary embodiment.
Figure 5B:
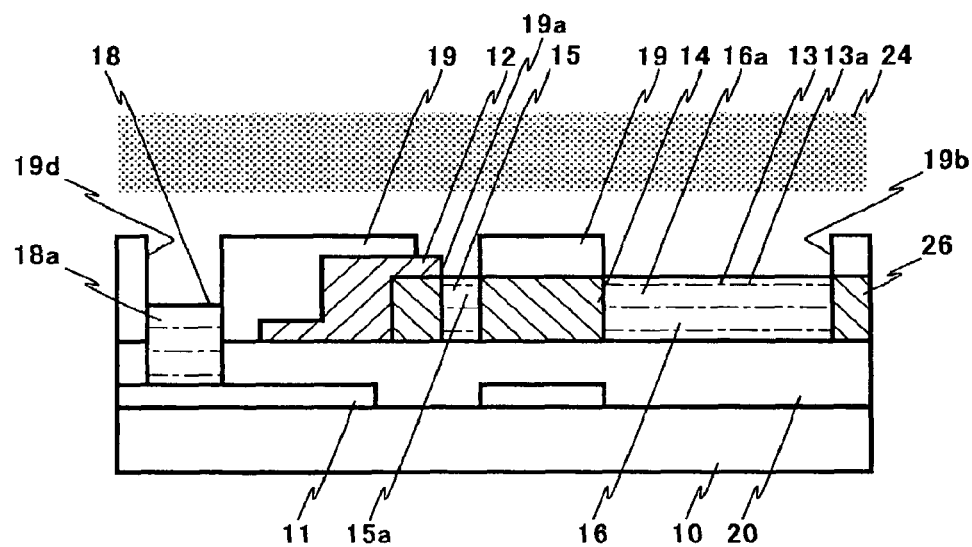
FIG. 5B is a cross-sectional view taken along the line VB-VB in FIG. 5A.

Then, the source metal film is patterned into a source signal line 12 electrically connected with the source terminal 17, as illustrated in FIGS. 5A and 5B.

The reducing step (exposure to hydrogen plasma) and the formation of the source metal film 20 are successively carried out without exposing a resultant to atmosphere.

The purpose of applying hydrogen plasma to a resultant is to accomplish sufficient ohmic contact between the source signal line 12 and a part of the oxide-semiconductor film 26 by reducing the oxide-semiconductor film 26 at a surface thereof to thereby generate electron donors caused by oxygen holes.

Then, as illustrated in FIG. 5B, a protection insulating film 19 is formed over the gate insulating film 20, the source signal line 12, and the oxide-semiconductor film 26. For instance, the protection insulating film 19 is comprised of a silicon nitride film, and has a thickness of about 300 nanometers.

Then, the protection insulating film 19 are etched for removal in areas corresponding to the opening 19a located above the low-resistivity area 15a of the source 15, the opening 19b located above both the low-resistivity area 13a of the pixel electrode 13 and the low-resistivity area 16a of the drain 16, the opening 19c located above the low-resistivity area 17a of the source terminal 17, and the opening 19d located above the low-resistivity area 18a of the gate terminal 18, to thereby form the openings 19a, 19b, 19c and 19d, as illustrated in FIGS. 5A and 5B.

Thus, the oxide-semiconductor film 26 is exposed outside through the openings 19a, 19b, 19c and 19d.

As mentioned above, the opening 19c located above the source terminal 17 acts also as a source terminal contact hole, and the opening 19d located above the gate terminal 18 acts also as a gate terminal contact hole.

Then, the oxide-semiconductor film 26 is exposed to either reducing plasma 24 or plasma 24 containing doping element(s), that is, at least one of B, Al, Ga, In and F through the openings 19a, 19b, 19c and 19d.

As a result, oxygen holes are positively generated, and accordingly, electron donors are generated in the low-resistivity areas 13a, 15a, 16a, 17a and 18a. Resistivities of the low-resistivity areas 13a, 15a, 16a, 17a and 18a are reduced to, for instance, about $1/10^5$ of the resistivities the low-resistivity areas 13a, 15a, 16a, 17a and 18a had before being exposed to the plasma 24.

Thus, there is completed the thin-film transistor array illustrated in FIGS. 1A and 1B.

The thin-film transistor array can have desired ON-characteristics, because the source 15 and the drain 16 have sufficiently small resistance.

Furthermore, since the gate terminal 18 and the source terminal 17 have sufficiently small resistance, it would be possible to reduce a contact resistance to be generated when the gate terminal 18 and the source terminal 17 are compressed to an external flexible printed circuit board including an anisotropic electrically conductive film.

Accordingly, a liquid crystal display device including the above-mentioned thin-film transistor array as a pixel driver could have highly accurate and highly reliable characteristics.

The thin-film transistor array in accordance with the first exemplary embodiment includes the electrically insulating substrate 10, a plurality of the thin-film transistors 100 arranged in a matrix on the electrically insulating substrate 10, and each including the channel 14, the source 15, and the drain 16 each comprised of the oxide-semiconductor film 26, the pixel electrode 13 integrally formed with the drain 16 of the thin-film transistor 100, the source signal line 12 through which a source signal is transmitted to the thin-film transistors 100 located on a column, the gate signal line 11 through which a gate signal is transmitted to the thin-film transistors 100 located on a row, the source terminal 17 formed at an end of the source signal line 11, and the gate terminal 18 formed at an end of the gate signal line 11, wherein the source terminal 17 and the gate terminal 18 are formed in the same layer as a layer in which the channel 14 is formed, and the source terminal 17 and the gate terminal 18 have the same electric conductivity as that of the pixel electrode 13.

If a terminal is composed of metal, the metal is naturally oxidized at a surface thereof by oxygen existing in atmosphere, and accordingly, reliability to electrical connection with an external driver circuit through a flexible printed board would be degraded.

In contrast, the thin-film transistor array in accordance with the first exemplary embodiment can present significantly enhanced reliability to the electrical connection, because oxide semiconductor which is one of oxides is stable to oxygen existing in atmosphere.

Furthermore, after all of the layer structure in the thin-film transistor array has been formed, the openings 19a, 19b, 19c and 19d are formed in a top layer, that is, the protection insulating film 19, and then, the oxide-semiconductor film is exposed to the reducing plasma 24 or the plasma 24 containing doping element(s). As a result, it would be possible to simultaneously reduce resistances in the source terminal 17, the gate terminal 18, the source 15, the drain 16, and the pixel electrode 13, ensuring that the thin-film transistor array can be fabricated in accordance with a low-cost process without an increase in a number of carrying out a photolithography step.

In the above-mentioned first exemplary embodiment, the oxide-semiconductor film 26 is rendered low-resistive by exposing it to the plasma 24. In place of exposing to the plasma 24, the oxide-semiconductor film 26 may be rendered low-resistive by doping impurity thereinto. This is applied to later-mentioned exemplary embodiments.

In the above-mentioned first exemplary embodiment, the thin-film transistors 100 are arranged in a matrix, that is, in column and row directions. The thin-film transistors 100 may be one-dimensionally or arbitrarily arranged. This is applied to later-mentioned exemplary embodiments.

Second Exemplary Embodiment

Hereinbelow is explained a method of a thin-film transistor array in accordance with the second exemplary embodiment, with reference to FIGS. 6A to 9B.

The thin-film transistor array in accordance with the second exemplary embodiment is of a bottom gate planar type.

FIGS. 6A, 7A, 8A and 9A are plain views showing respective steps to be carried out in a method of fabricating the thin-film transistor array in accordance with the second exemplary embodiment, and FIGS. 6B, 7B, 8B and 9B are cross-sectional views taken along the lines VIB-VIB, VIIB-VIIB, VIIIB-VIIIB, and IXB-IXB, respectively.

Parts or elements in the second exemplary embodiment that correspond to those of the first exemplary embodiment have been provided with the same reference numerals.

Figure 6A:
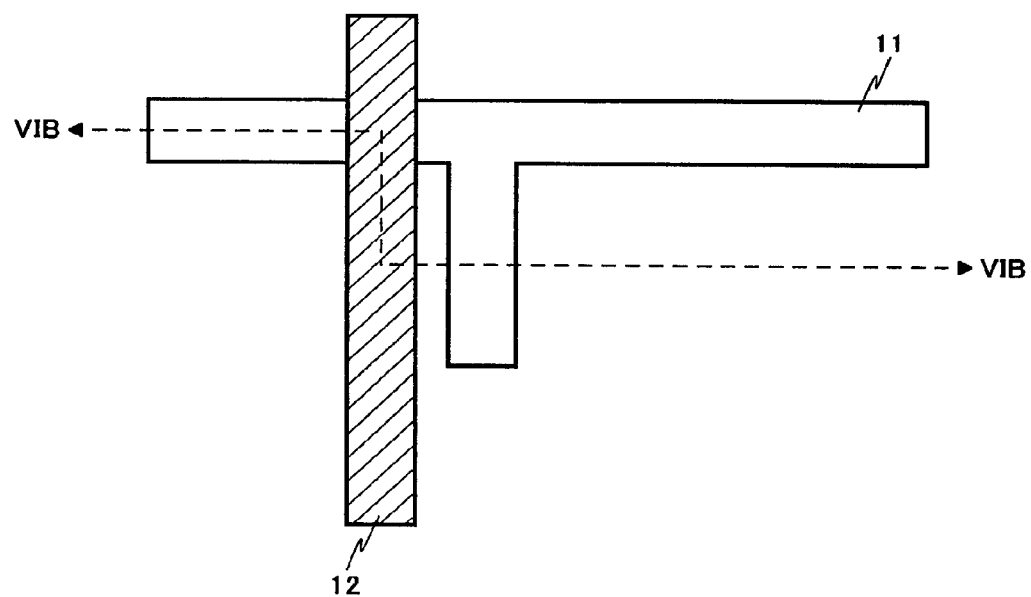
FIG. 6A is a plain view of a thin-film transistor array in accordance with the second exemplary embodiment.
Figure 6B:
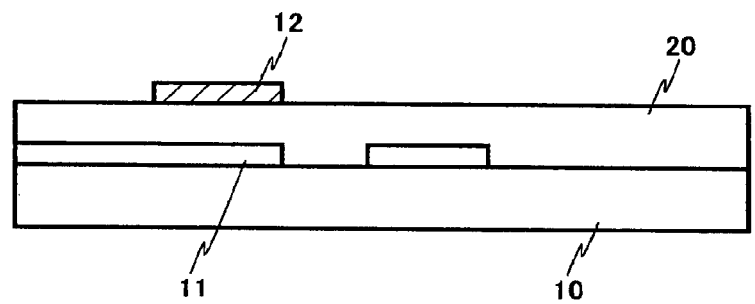
FIG. 6B is a cross-sectional view taken along the line VIB-VIB in FIG. 6A.

First, as illustrated in FIGS. 6A and 6B, a gate metal film (defined as "an electrically conductive film" in claims) is formed on the electrically insulating substrate 10. For instance, the gate metal film is composed of chromium (Cr), and is formed by sputtering on the electrically insulating substrate 10. The electrically insulating substrate 10 is comprised of a resin substrate, for instance.

Then, the gate metal film is patterned into the gate signal line 11.

Then, as illustrated in FIG. 6B, a gate insulating film 20 is formed on the electrically insulating substrate 10 such that the gate signal line 11 is completely covered with the gate insulating film 20.

Then, a source metal film (defined as "an electrically conductive film" in claims) is formed on the gate insulating film 20.

Then, the source metal film is patterned into the source signal line 12.

Figure 7A:
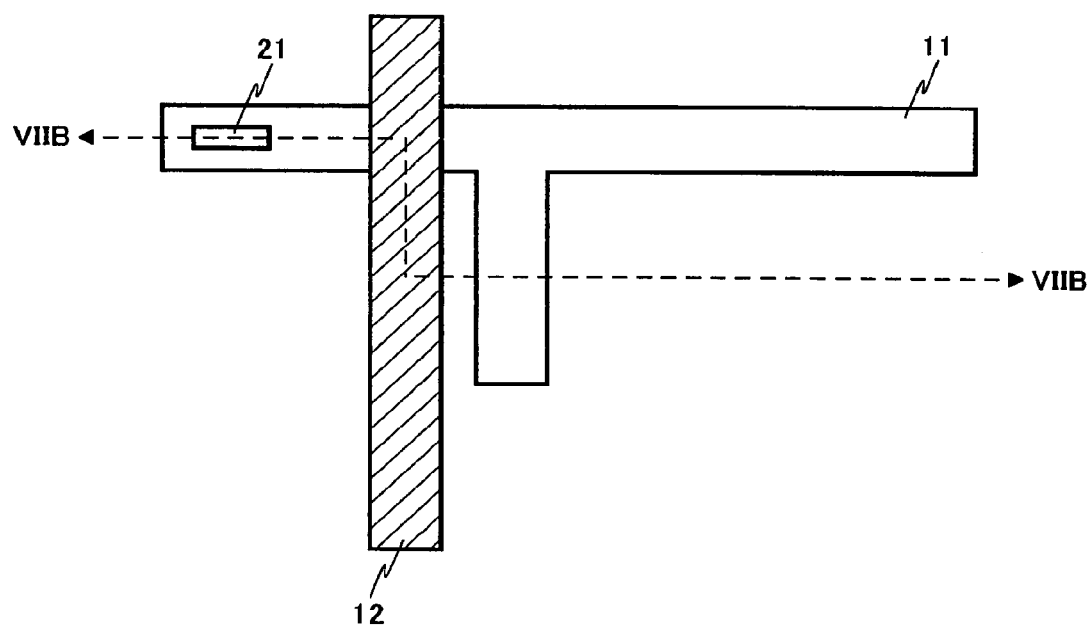
FIG. 7A is a plain view of a thin-film transistor array in accordance with the second exemplary embodiment.
Figure 7B:
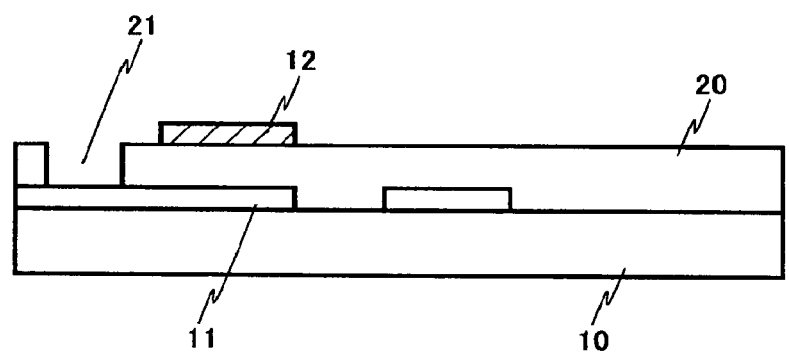
FIG. 7B is a cross-sectional view taken along the line VIIB-VIIB in FIG. 7A.

Then, as illustrated in FIGS. 7A and 7B, a portion of the gate insulating film 20 located above an end of the gate signal line 11 is etched for removal to thereby form a gate terminal contact hole 21 having a desired shape.

Figure 8A:
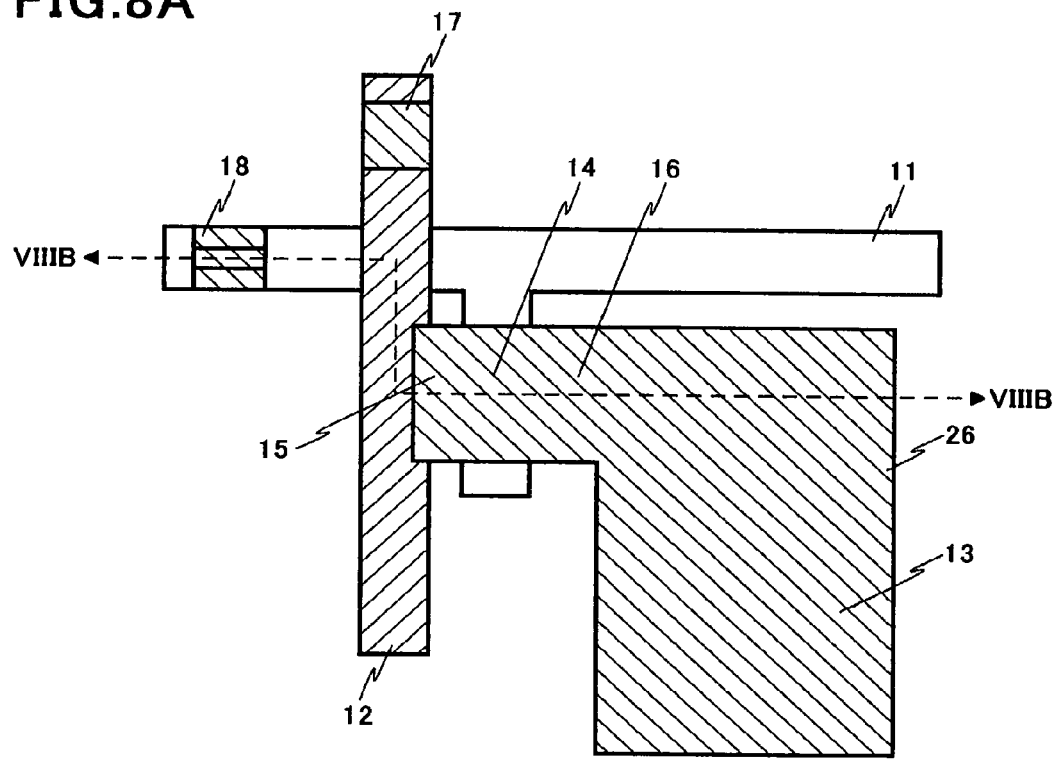
FIG. 8A is a plain view of a thin-film transistor array in accordance with the second exemplary embodiment.
Figure 8B:
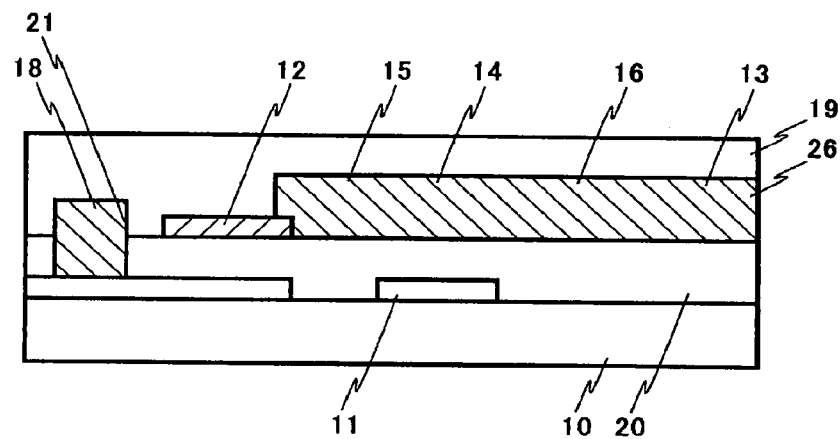
FIG. 8B is a cross-sectional view taken along the line VIIIB-VIIIB in FIG. 8A.

Then, the oxide-semiconductor film 26 is formed on the gate insulating film 20, as illustrated in FIGS. 8A and 8B.

Since a portion of the gate insulating film 20 located above an end of the gate signal line 11 was etched for removal to thereby form the gate terminal contact hole 21, the oxide-semiconductor film 26 is formed further on an end of the gate signal line 11, as illustrated in FIGS. 8A and 8B.

Then, as illustrated in FIGS. 8A and 8B, the oxide-semiconductor film 26 is patterned into the channel 14, the source 15, and the drain 16 of the thin-film transistor 100, the pixel electrode 13, the gate terminal 18 located above the gate terminal contact hole 21, and the source terminal 17. Thus, the channel 14, the source 15, and the drain 16 of the thin-film transistor 100, the pixel electrode 13, the gate terminal 18 located above the gate terminal contact hole 21, and the source terminal 17 are formed in a common layer, and are composed of a common material.

Then, as illustrated in FIG. 8B, a protection insulating film 19 is formed over the gate insulating film 20, the source signal line 12, and the oxide-semiconductor film 26.

Figure 9A:
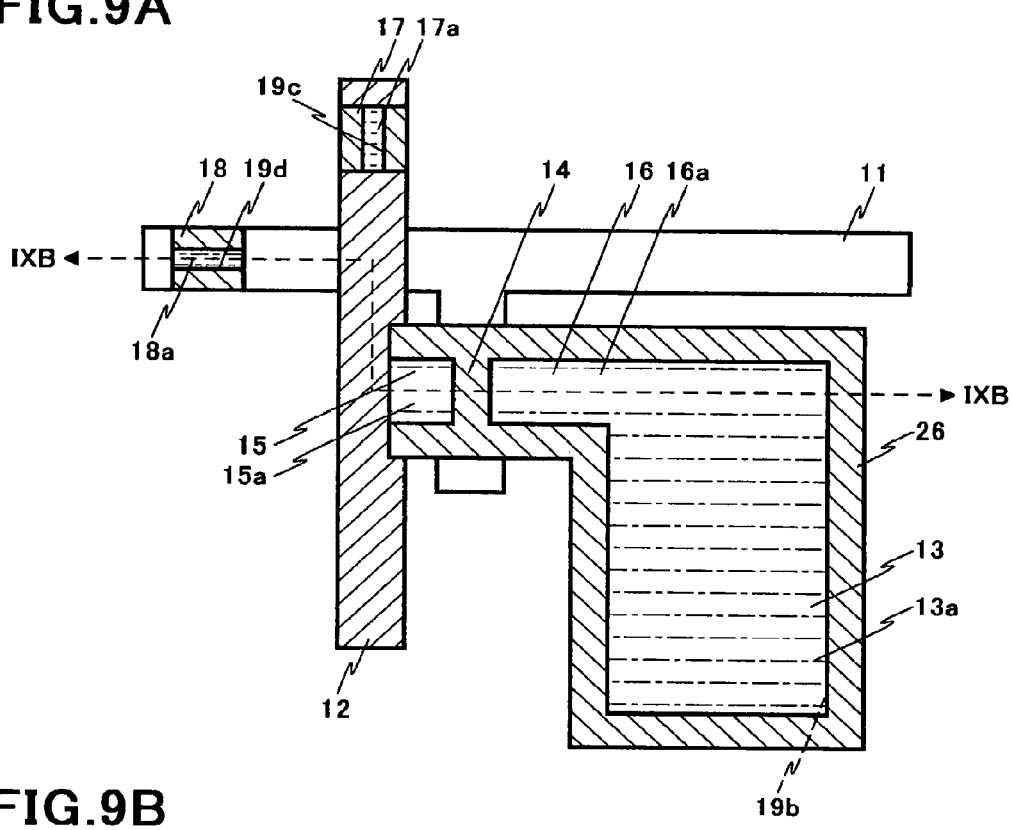
FIG. 9A is a plain view of a thin-film transistor array in accordance with the second exemplary embodiment.
Figure 9B:
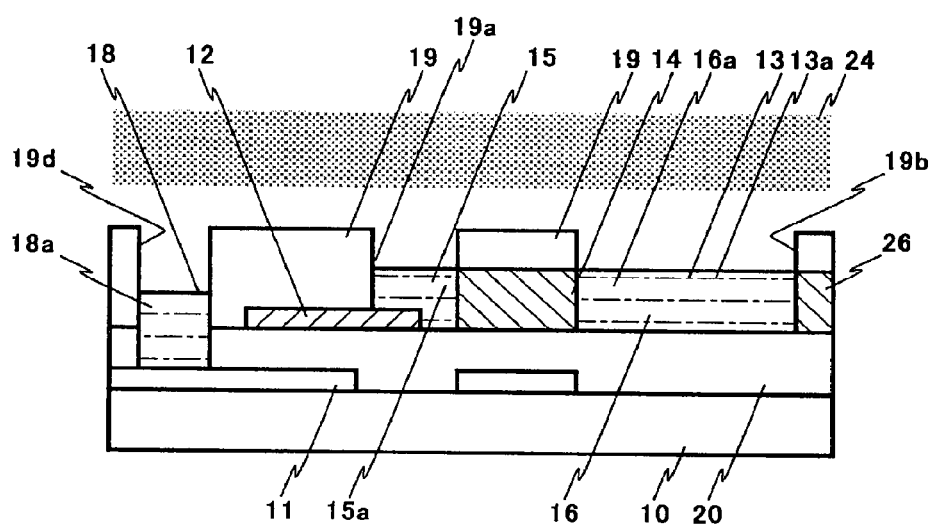
FIG. 9B is a cross-sectional view taken along the line IXB-IXB in FIG. 9A.

Then, as illustrated in FIGS. 9A and 9B, the openings 19a, 19b, 19c and 19d are formed at the protection insulating film 19.

Specifically, the protection insulating film 19 are etched for removal in areas corresponding to the openings 19a located above the low-resistivity area 15a of the source 15, the opening 19b located above both the low-resistivity area 13a of the pixel electrode 13 and the low-resistivity area 16a of the drain 16, the opening 19c located above the low-resistivity area 17a of the source terminal 17, and the opening 19d located above the low-resistivity area 18a of the gate terminal 18, to thereby form the openings 19a, 19b, 19c and 19d, as illustrated in FIGS. 9A and 9B.

As mentioned above, the opening 19c located above the source terminal 17 acts also as a source terminal contact hole, and the opening 19d located above the gate terminal 18 acts also as a gate terminal contact hole.

Then, the oxide-semiconductor film 26 is exposed to either reducing plasma 24 or plasma 24 containing doping element(s), that is, at least one of B, Al, Ga, In and F through the openings 19a, 19b, 19c and 19d.

As a result, the areas 13a, 15a, 16a, 17a and 18a are rendered low-resistive.

Thus, there is completed the thin-film transistor array illustrated in FIGS. 9A and 9B.

The thin-film transistor array in accordance with the second exemplary embodiment provides the following advantage as well as the advantages provided by the thin-film transistor array in accordance with the above-mentioned first exemplary embodiment.

Since the thin-film transistor array in accordance with the first exemplary embodiment is of a bottom gate stagger type, there is formed a drain on-current path in a thickness-wise direction of the source and the drain. Accordingly, a resistance formed in a thickness-wise direction of the oxide-semiconductor film is added to a channel resistance. This may reduce an on-current.

In contrast, since the thin-film transistor array in accordance with the second exemplary embodiment is of a bottom gate coplanar type, there is not formed a current path in a thickness-wise direction of the source and the drain. Thus, the thin-film transistor array in accordance with the second exemplary embodiment can have a greater on-current than the same obtained in the thin-film transistor array in accordance with the first exemplary embodiment.

Third Exemplary Embodiment

Hereinbelow is explained a method of a thin-film transistor array in accordance with the third exemplary embodiment, with reference to FIGS. 10A to 13B.

The thin-film transistor array in accordance with the third exemplary embodiment is of a top gate planar type.

FIGS. 10A, 11A, 12A and 13A are plain views showing respective steps to be carried out in a method of fabricating the thin-film transistor array in accordance with the third exemplary embodiment, and FIGS. 10B, 11B, 12B and 13B are cross-sectional views taken along the lines XB-XB, XIB-XIB, XIIB-XIIB, and XIIIB-XIIIB, respectively.

Parts or elements in the third exemplary embodiment that correspond to those of the first exemplary embodiment have been provided with the same reference numerals.

Figure 10A:
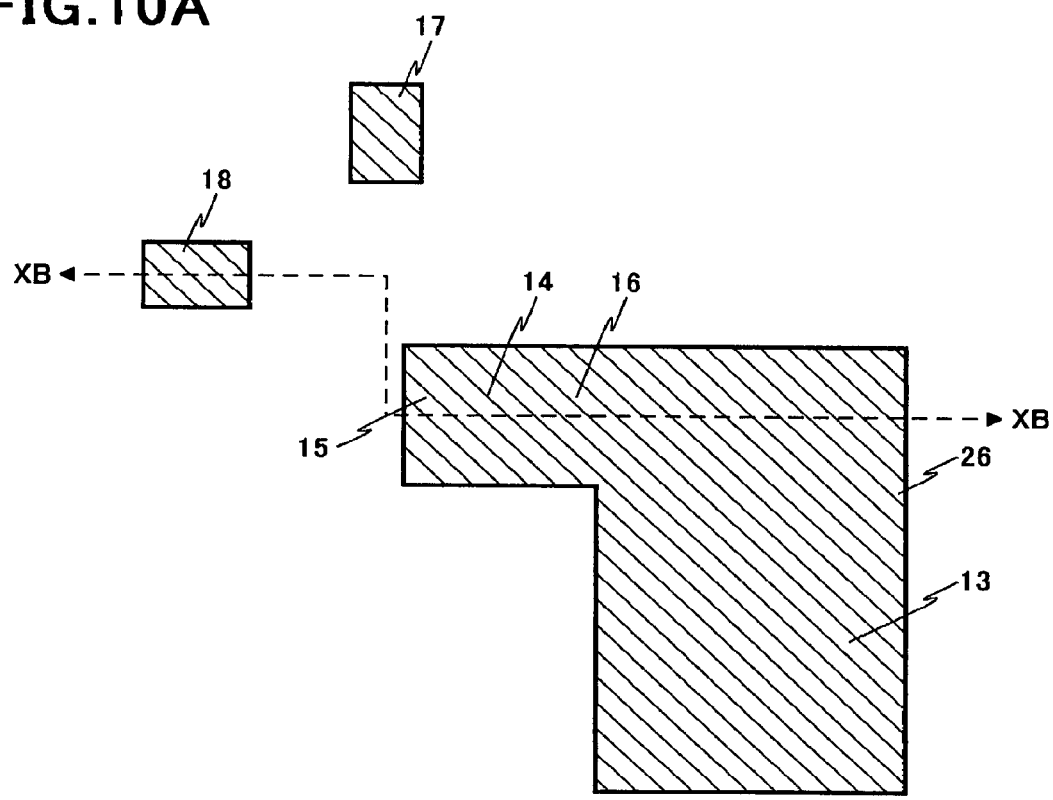
FIG. 10A is a plain view of a thin-film transistor array in accordance with the third exemplary embodiment.
Figure 10B:
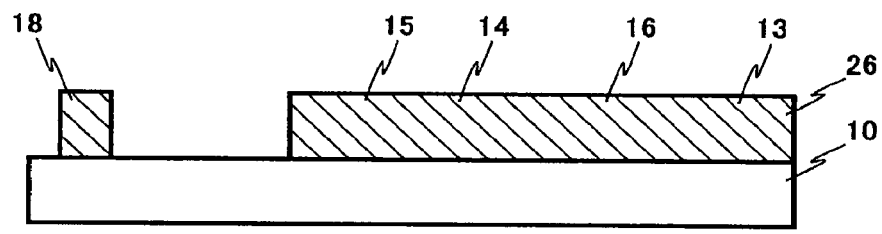
FIG. 10B is a cross-sectional view taken along the line XB-XB in FIG. 10A.

First, as illustrated in FIGS. 10A and 10B, an amorphous ZnO film is formed by sputtering at room temperature on the electrically insulating substrate 10. The electrically insulating substrate 10 is comprised of a resin substrate, for instance.

Then, XeCl excimer laser having a wavelength of 308 nanometers is irradiated onto the ZnO film. As a result, the amorphous ZnO film is crystallized into an oxide-semiconductor film 26.

Such crystallization enhances electron mobility, and further enhances performance for driving a thin-film transistor. However, it is not always necessary to use laser for crystallizing the ZnO film.

Then, as illustrated in FIGS. 10A and 10B, the oxide-semiconductor film 26 is patterned into the channel 14, the source 15, and the drain 16 of the thin-film transistor 100, the pixel electrode 13, the gate terminal 18, and the source terminal 17. Thus, the channel 14, the source 15, and the drain 16 of the thin-film transistor 100, the pixel electrode 13, the gate terminal 18 located above the gate terminal contact hole 21, and the source terminal 17 are formed in a common layer, and are composed of a common material.

Figure 11A:
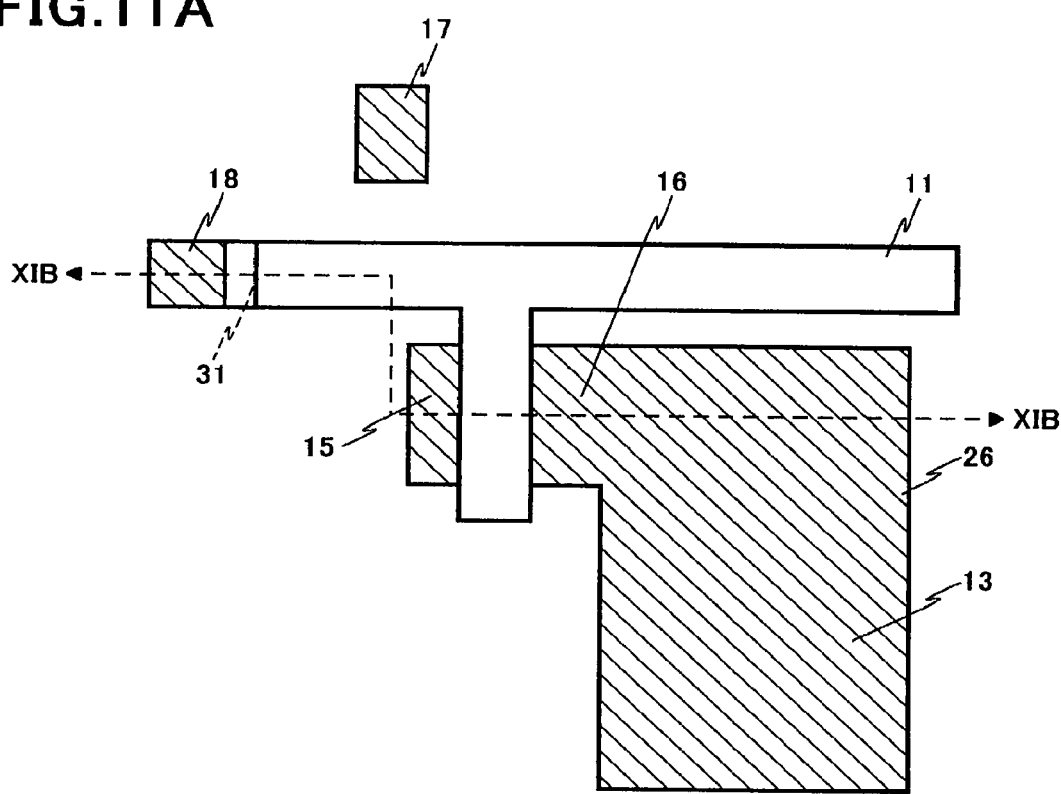
FIG. 11A is a plain view of a thin-film transistor array in accordance with the third exemplary embodiment.
Figure 11B:
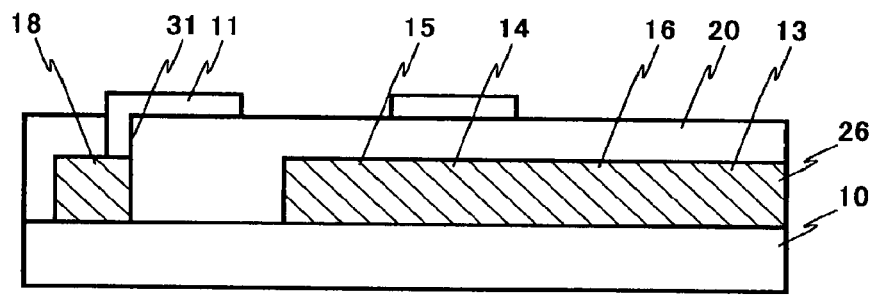
FIG. 11B is a cross-sectional view taken along the line XIB-XIB in FIG. 11A.

Then, as illustrated in FIG. 11B, a gate insulating film 20 is formed over the oxide-semiconductor film 26, the electrically insulating substrate 10, and the gate terminal 18. For instance, the gate insulating film 20 is formed by chemical vapor deposition (CVD) by a thickness of 200 nanometers, and is composed of silicon nitride.

Then, a portion of the gate insulating film 20 corresponding to an end of the gate signal line 11 is etched for removal to thereby form a gate terminal contact hole 31 having a desired shape.

Then, as illustrated in FIGS. 11A and 11B, a gate metal film (defined as "an electrically conductive film" in claims) is formed on the gate insulating film 20. For instance, the gate metal film is formed by sputtering, and has a thickness of about 100 nanometers.

Then, the gate metal film is patterned into a gate signal line 11 which is electrically connected to the gate terminal 18 through the gate terminal contact hole 31.

Figure 12A:
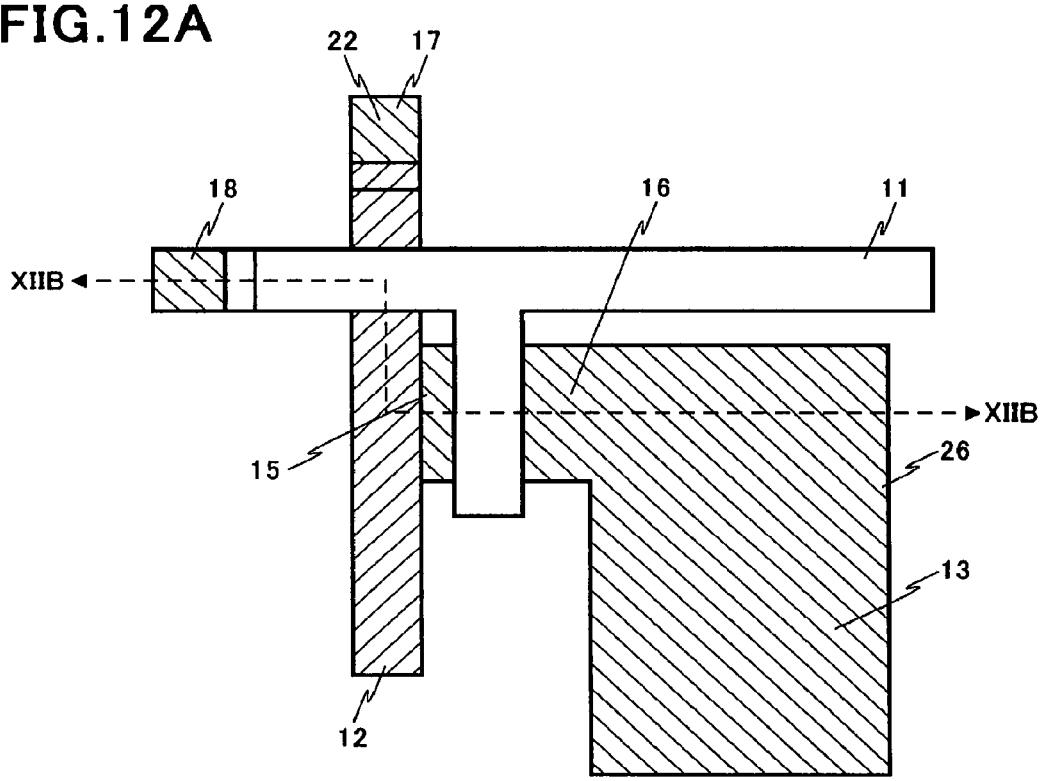
FIG. 12A is a plain view of a thin-film transistor array in accordance with the third exemplary embodiment.
Figure 12B:
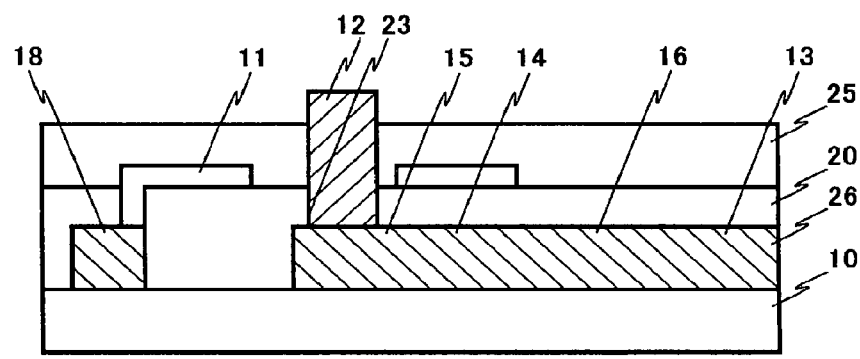
FIG. 12B is a cross-sectional view taken along the line XIIB-XIIB in FIG. 12A.

Then, as illustrated in FIGS. 12A and 12B, an interlayer insulating film 25 is formed on the gate insulating film 20. For instance, the interlayer insulating film 25 is formed by sputtering on the gate insulating film 20, and is comprised of a silicon dioxide ($SiO_2$) film.

Then, as illustrated in FIGS. 12A and 12B, a portion located above an end of the source signal line 12 and a portion located above the low-resistive area 15a of the source 15 in the interlayer insulating film 25 and the gate insulating film 20 are etched for removal to thereby form a source terminal contact hole 22 (see FIG. 12A) having a desired shape and a source contact hole 23 (see FIG. 12B) having a desired shape.

Then, as illustrated in FIGS. 12A and 12B, a source metal film (defined as "an electrically conductive film" in claims) is formed on the interlayer insulating film 25 such that the source contact hole 23 is filled with a source metal of which the source metal film is composed. For instance, the source metal film is formed by sputtering on the interlayer insulating film 25, and is comprised of an aluminum film. For instance, the source metal film has a thickness of 200 nanometers.

Then, the source metal film is patterned into a source signal line 12 through which the source terminal 17 and the source 15 are electrically connected to each other.

Figure 13A:
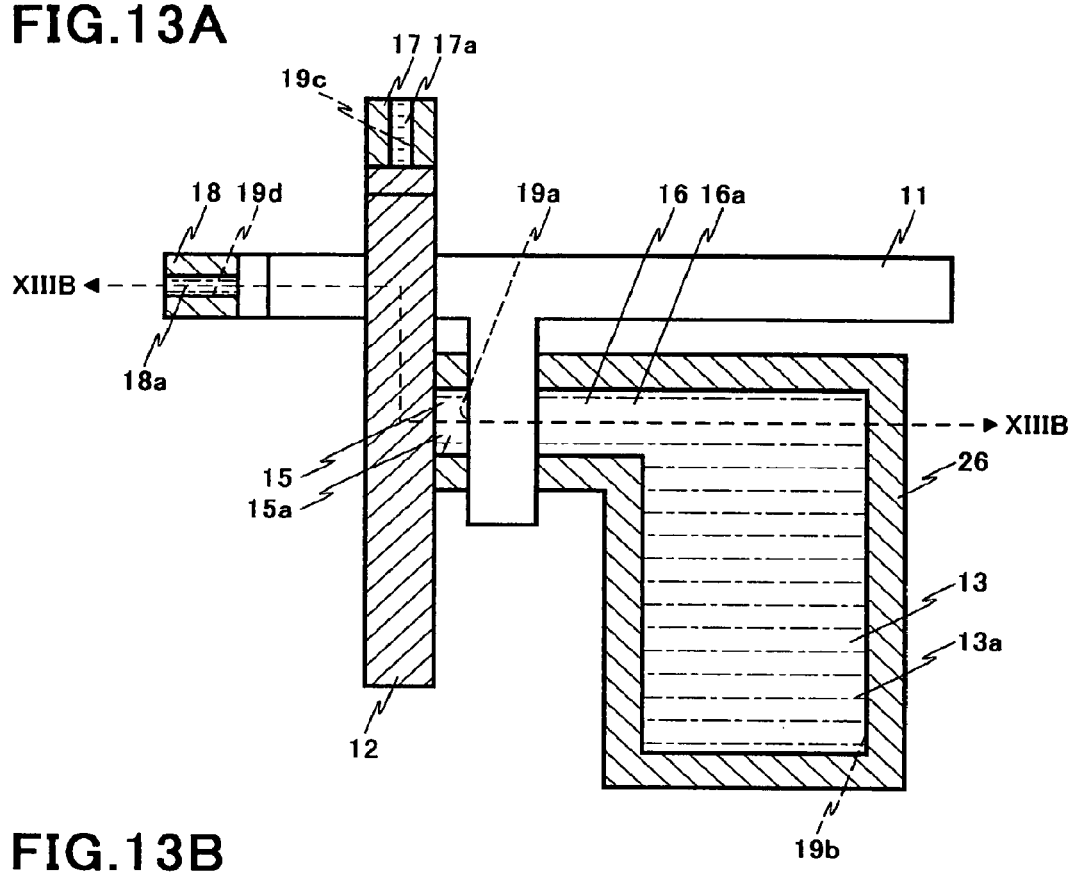
FIG. 13A is a plain view of a thin-film transistor array in accordance with the third exemplary embodiment.
Figure 13B:
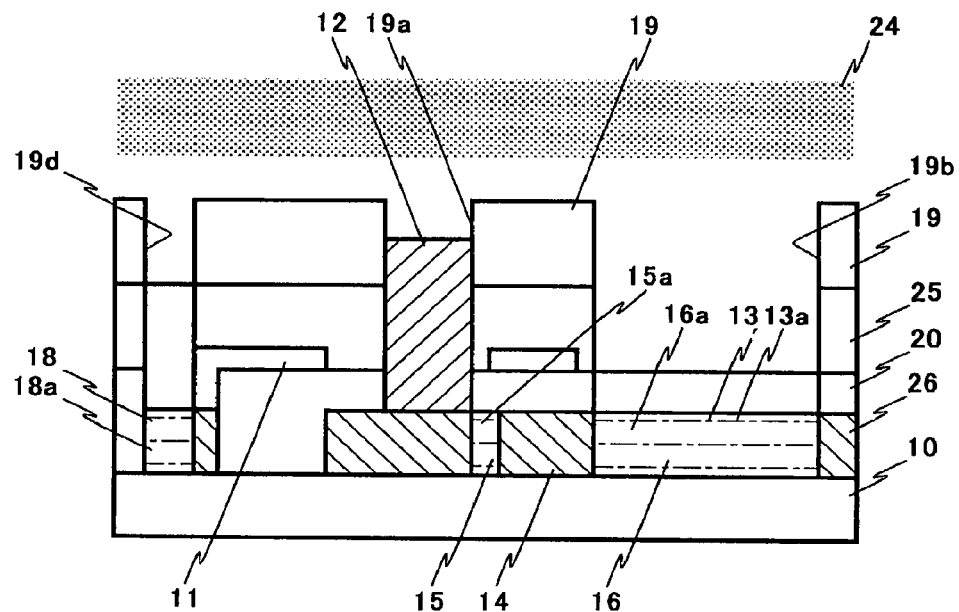
FIG. 13B is a cross-sectional view taken along the line XIIIB-XIIIB in FIG. 13A.

Then, as illustrated in FIGS. 13A and 13B, a protection insulating film 19 is formed on the interlayer insulating film 25. For instance, the protection insulating film 19 is formed by sputtering on the interlayer insulating film 25, and is comprised of a silicon nitride film. For instance, the protection insulating film 19 has a thickness of about 200 nanometers.

Then, as illustrated in FIGS. 13A and 13B, the openings 19a, 19b, 19c and 19d are formed at the protection insulating film 19, the interlayer insulating film 25, and the gate insulating film 20.

Specifically, the protection insulating film 19, the interlayer insulating film 25, and the gate insulating film 20 are etched for removal in areas corresponding to the openings 19a located above the low-resistivity area 15a of the source 15, the opening 19b located above both the low-resistivity area 13a of the pixel electrode 13 and the low-resistivity area 16a of the drain 16, the opening 19c located above the low-resistivity area 17a of the source terminal 17, and the opening 19d located above the low-resistivity area 18a of the gate terminal 18, to thereby form the openings 19a, 19b, 19c and 19d, as illustrated in FIGS. 13A and 13B.

In the third exemplary embodiment, the openings 19a, 19b, 19c and 19d extend throughout the protection insulating film 19, the interlayer insulating film 25, and the gate insulating film 20.

The opening 19c located above the source terminal 17 acts also as a source terminal contact hole, and the opening 19d located above the gate terminal 18 acts also as a gate terminal contact hole.

Then, the oxide-semiconductor film 26 is exposed to either reducing plasma 24 or plasma 24 containing doping element(s), that is, at least one of B, Al, Ga, In and F through the openings 19a, 19b, 19c and 19d.

As a result, the areas 13a, 15a, 16a, 17a and 18a are rendered low-resistive.

Thus, there is completed the thin-film transistor array illustrated in FIGS. 13A and 13B.

The thin-film transistor array in accordance with the third exemplary embodiment provides the following advantage as well as the advantages provided by the thin-film transistor array in accordance with the above-mentioned first exemplary embodiment.

Since the thin-film transistor array in accordance with the third exemplary embodiment is of a coplanar type similarly to the thin-film transistor array in accordance with the second exemplary embodiment, there is not formed a current path in a thickness-wise direction of the source and the drain. Thus, the thin-film transistor array in accordance with the third exemplary embodiment can have a greater on-current than the same obtained in the thin-film transistor array in accordance with the first exemplary embodiment.

Furthermore, since the thin-film transistor array in accordance with the third exemplary embodiment is of a top gate type whereas the thin-film transistor arrays in accordance with the first and second exemplary embodiment are of a bottom gate type, a channel is formed at an upper surface of the oxide semiconductor. Oxide semiconductor tends to be crystallized even when an oxide-semiconductor film is formed at a low temperature, in which case, crystal grows from a lower surface in a thickness-wise direction. Accordingly, crystallization is better at an upper surface of oxide semiconductor than at a lower surface of oxide semiconductor. Thus, the thin-film transistor array in accordance with the third exemplary embodiment having a top gate structure including a channel formed at an upper surface of oxide semiconductor can have a higher on-current than the thin-film transistor arrays in accordance with the first and second exemplary embodiment both having a bottom gate structure.

Fourth Exemplary Embodiment

Hereinbelow is explained a method of a thin-film transistor array in accordance with the fourth exemplary embodiment, with reference to FIGS. 14A to 17B.

The thin-film transistor array in accordance with the fourth exemplary embodiment is of a top gate stagger type.

FIGS. 14A, 15A, 16A and 17A are plain views showing respective steps to be carried out in a method of fabricating the thin-film transistor array in accordance with the fourth exemplary embodiment, and FIGS. 14B, 15B, 16B and 17B are cross-sectional views taken along the lines XIVB-XIVB, XVB-XVB, XVIB-XVIB, and XVIIB-XVIIB, respectively.

Parts or elements in the fourth exemplary embodiment that correspond to those of the first exemplary embodiment have been provided with the same reference numerals.

Figure 14A:
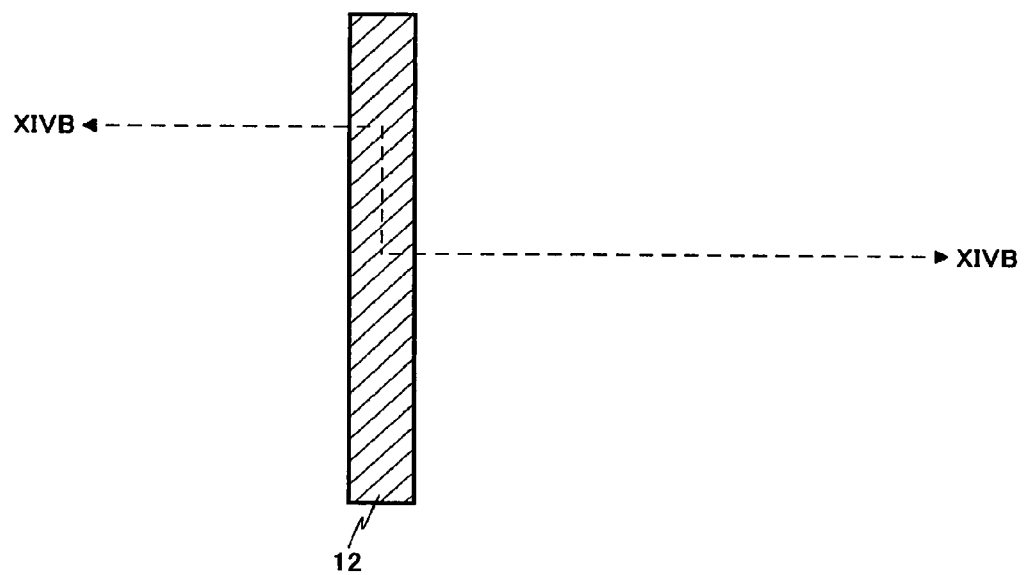
FIG. 14A is a plain view of a thin-film transistor array in accordance with the fourth exemplary embodiment.
Figure 14B:
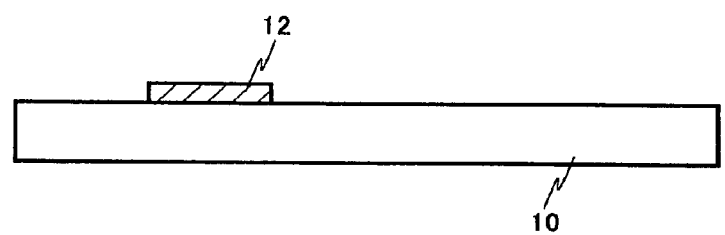
FIG. 14B is a cross-sectional view taken along the line XIVB-XIVB in FIG. 14A.

First, as illustrated in FIGS. 14A and 14B, a source metal film (defined as "an electrically conductive film" in claims) is formed on the electrically insulating substrate 10. The electrically insulating substrate 10 is comprised of a resin substrate, for instance.

Then, the source metal film is patterned into a source signal line 12.

Figure 15A:
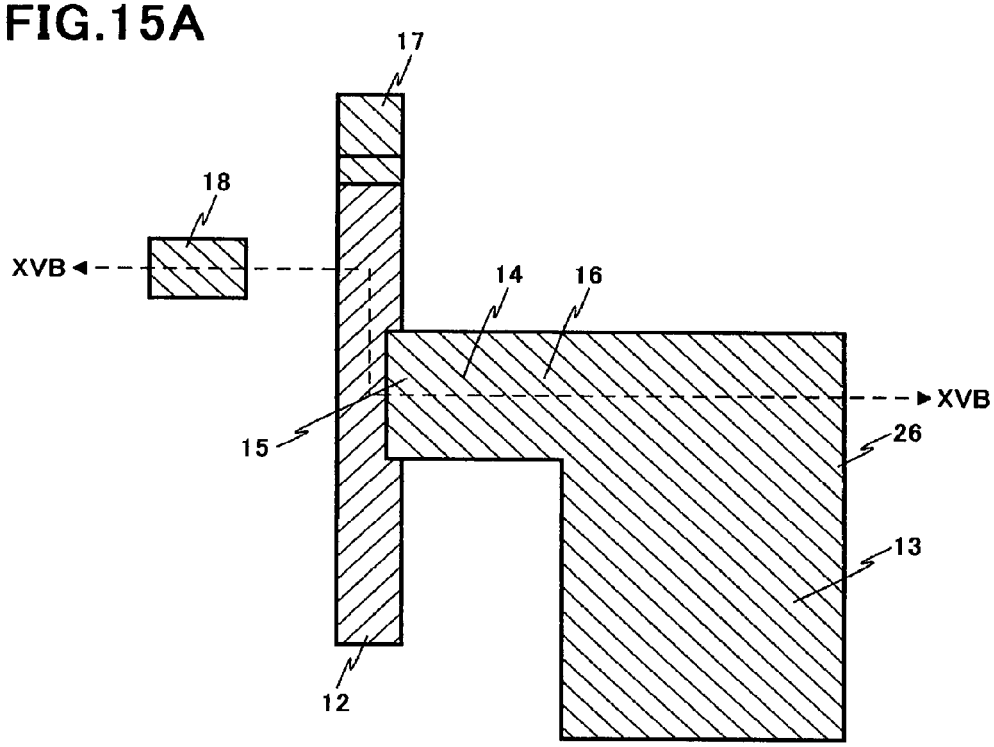
FIG. 15A is a plain view of a thin-film transistor array in accordance with the fourth exemplary embodiment.
Figure 15B:
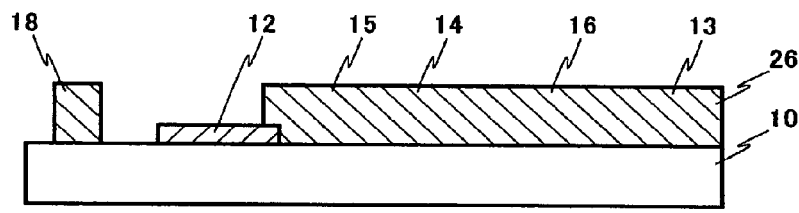
FIG. 15B is a cross-sectional view taken along the line XVB-XVB in FIG. 15A.

Then, an oxide-semiconductor film 26 is formed on the electrically insulating substrate 10 and the source signal line 12, as illustrated in FIGS. 15A and 15B.

Then, the oxide-semiconductor film 26 is patterned into the channel 14, the source 15, and the drain 16 of the thin-film transistor 100, the pixel electrode 13, the gate terminal 18, and the source terminal 17. Thus, the channel 14, the source 15, and the drain 16 of the thin-film transistor 100, the pixel electrode 13, the gate terminal 18 located above the gate terminal contact hole 21, and the source terminal 17 are formed in a common layer, and are composed of a common material.

Figure 16A:
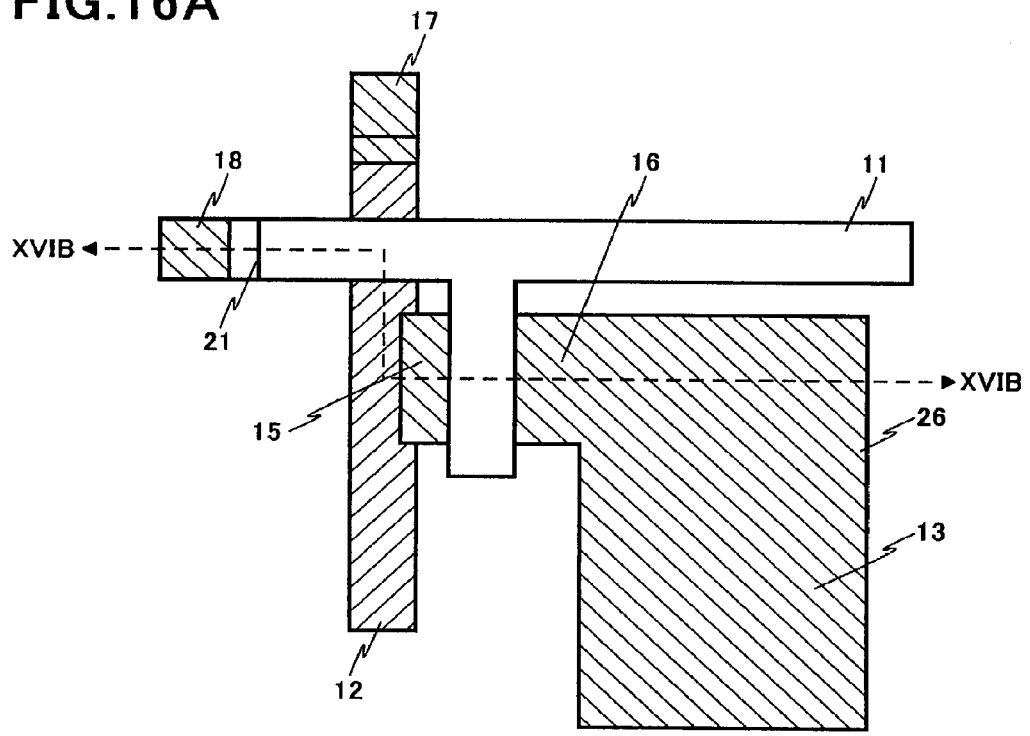
FIG. 16A is a plain view of a thin-film transistor array in accordance with the fourth exemplary embodiment.
Figure 16B:
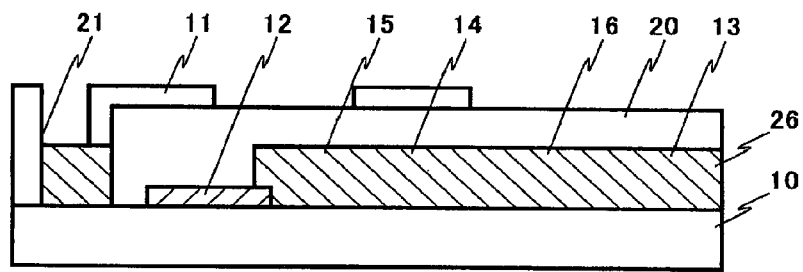
FIG. 16B is a cross-sectional view taken along the line XVIB-XVIB in FIG. 16A.

Then, as illustrated in FIG. 16B, a gate insulating film 20 is formed over the electrically insulating substrate 10, the source signal line 12, and the oxide-semiconductor film 26.

Then, a portion of the gate insulating film 20 located above the gate terminal 18 is etched for removal to thereby form a gate terminal contact hole 21 having a desired shape.

Then, as illustrated in FIGS. 16A and 16B, a gate metal film (defined as "an electrically conductive film" in claims) is formed on the gate insulating film 20.

Then, the gate metal film 20 is patterned into a gate signal line 11 which is electrically connected to the gate terminal 18 through the gate terminal contact hole 21.

Then, a protection insulating film 19 is formed on the gate metal film 20 and the gate signal line 11.

Figure 17A:
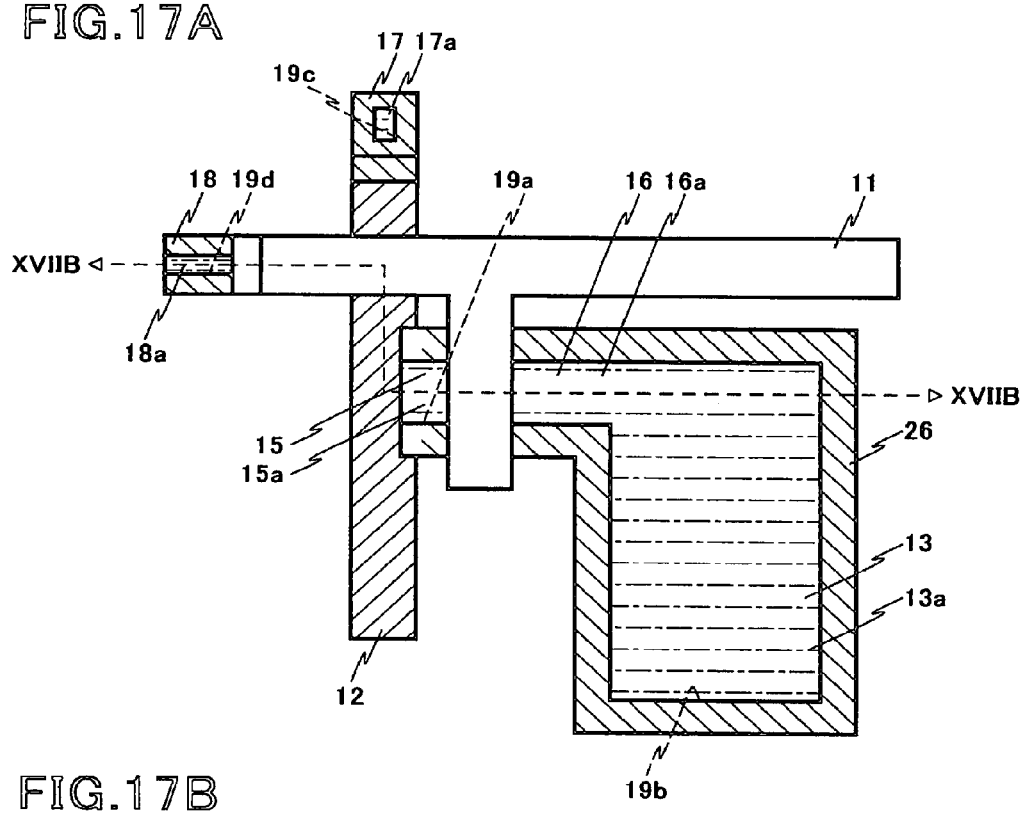
FIG. 17A is a plain view of a thin-film transistor array in accordance with the fourth exemplary embodiment.
Figure 17B:
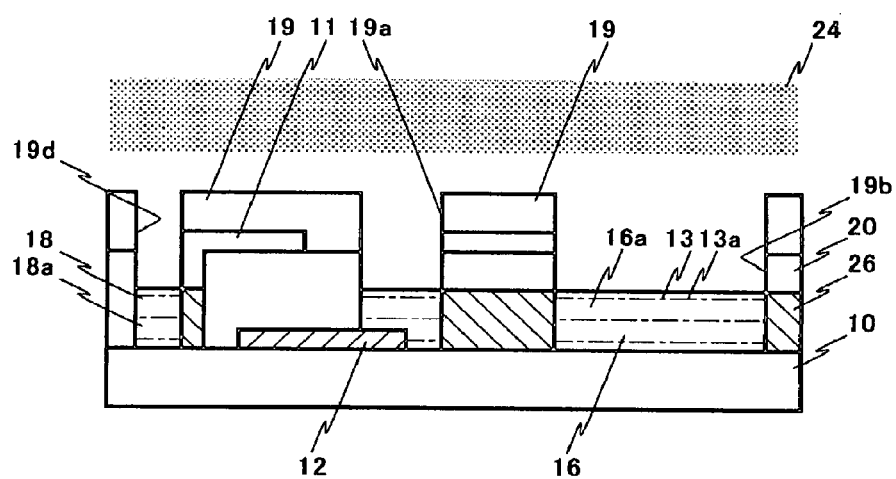
FIG. 17B is a cross-sectional view taken along the line XVIIB-XVIIB in FIG. 17A.

Then, as illustrated in FIGS. 17A and 17B, the openings 19a, 19b, 19c and 19d are formed at the protection insulating film 19.

Specifically, the protection insulating film 19 are etched for removal in areas corresponding to the openings 19a located above the low-resistivity area 15a of the source 15, the opening 19b located above both the low-resistivity area 13a of the pixel electrode 13 and the low-resistivity area 16a of the drain 16, the opening 19c located above the low-resistivity area 17a of the source terminal 17, and the opening 19d located above the low-resistivity area 18a of the gate terminal 18, to thereby form the openings 19a, 19b, 19c and 19d, as illustrated in FIGS. 17A and 17B.

The opening 19c located above the source terminal 17 acts also as a source terminal contact hole, and the opening 19d located above the gate terminal 18 acts also as a gate terminal contact hole.

Then, the oxide-semiconductor film 26 is exposed to either reducing plasma 24 or plasma 24 containing doping element(s), that is, at least one of B, Al, Ga, In and F through the openings 19a, 19b, 19c and 19d.

As a result, the areas 13a, 15a, 16a, 17a and 18a are rendered low-resistive.

Thus, there is completed the thin-film transistor array illustrated in FIGS. 17A and 17B.

The thin-film transistor array in accordance with the fourth exemplary embodiment provides the same advantages as the advantages provided by the thin-film transistor array in accordance with the first exemplary embodiment.

In the above-mentioned first to fourth exemplary embodiments, the oxide-semiconductor film 26 may be composed of amorphous or crystalline oxide containing at least one of Zn, Ga and In, in which case, the oxide-semiconductor film 26 may be formed by sputtering, evaporation or chemical vapor deposition (CVD).

In particular, a crystalline oxide film can be formed by irradiating XeCl excimer laser to an amorphous film. This is because the above-mentioned oxide semiconductor is almost transparent to visible light, but is opaque to XeCl excimer laser having a wavelength of 308 nanometers, and hence, absorbs the XeCl excimer laser.

It is possible to crystallize an amorphous film by irradiating laser or light having a wavelength shorter than a wavelength of visible light.

The oxide-semiconductor film may be formed by dissolving powdered oxide semiconductor into solvent, coating or printing the solvent onto an object, and heating the solvent to vaporize the solvent.

The reducing plasma 24 or the plasma 24 containing at least one of B, Al, Ga, In and F in the above-mentioned first to fourth exemplary embodiment may be comprised of rare gas plasma containing rare gas such as Ar or He, hydrogen plasma, or plasma containing fluoride gas or chloride gas of B, Al, Ga or In.

By controlling factors such as a gas flow rate, discharge power or discharge pressure for generating the above-mentioned plasma, it would be possible to reduce a resistivity of oxide semiconductor to be exposed to the plasma, to $1/10^{10}$ to $1/10^{2}$ of an original resistivity.

If the reduced resistivity is higher than $1/10^{2}$ of an original resistivity, a source, a drain and/or a terminal would not work well.

It is theoretically almost impossible to render the reduced resistivity smaller than $1/10^{10}$ of an original resistivity, and further, it is over specification to do so, and hence, it is not necessary to do so.

The oxide-semiconductor film 26 in the above-mentioned first to fourth exemplary embodiments is formed by sputtering. It should be noted that the oxide-semiconductor film 26 may be formed by evaporation, ion-plating or chemical vapor deposition (CVD). In particular, the formation of the oxide-semiconductor film 26 by sputtering makes it possible to have a qualified oxide-semiconductor film even if it is formed at room temperature, ensuring that a thin-film transistor can be fabricated on a resin substrate having a small resistance to heat.

The thin-film transistor array in accordance with the above-mentioned first to fourth exemplary embodiments are applicable to a pixel driver to be used in a flat panel display such as a liquid crystal display or an organic electroluminescence (EL) display. In particular, since oxide semiconductor is transparent, a pixel driver of a liquid crystal display to which the thin-film transistor array is applied ensures higher backlight transmissivity than a pixel driver to which conventional silicon semiconductor is applied, presenting a brighter high-performance display.

An oxide-semiconductor film, even when it was formed at room temperature, has electron mobility greater by about one column than the same of conventionally used amorphous silicon formed at 300 degrees centigrade. Hence, it is possible to fabricate a thin-film transistor array having superior characteristics, even if it was fabricated at room temperature. Hence, since the thin-film transistor array in accordance with the above-mentioned embodiments can have superior characteristics on a resin substrate having a small resistance to heat, it is possible to apply the thin-film transistor array to a display including a flexible resin substrate.

Furthermore, since an oxide-semiconductor film has electron mobility greater by about one column than the same of an amorphous silicon thin-film transistor, it would be possible to form a driver circuit including an NMOS inverter composed of oxide semiconductor, on an electrically insulating substrate simultaneously with formation of a display pixel.

Since oxide semiconductor is almost transparent to visible light, oxide semiconductor does not absorb visible light therein, and hence, optically excited carriers are scarcely generated in the oxide semiconductor. That is, if an electronic device including a thin-film transistor including an oxide-semiconductor film is used in a bright place, a drain off-current caused optical excitation is not increased. Accordingly, the thin-film transistor array in accordance with the above-mentioned first to fourth exemplary embodiments can be applied to a display driver to be used in a condition in which it is illuminated with backlight, or to an NMOS inverter circuit used in a condition in which it is exposed to external light.

It is preferable in the thin-film transistor array in accordance with the above-mentioned embodiments that at least a part of each of the source and drain, the pixel electrode, the source terminal, and the gate terminal is comprised of a low-resistivity area having a resistivity which is equal to or greater than $\frac{1}{10}^{10}$, but equal to or smaller than $\frac{1}{10}^{2}$ of a resistivity of the channel in equilibrium state in which no voltage is applied to the channel.

It is preferable in the thin-film transistor array in accordance with the above-mentioned embodiments that the oxide-semiconductor film is composed of amorphous oxide containing at least one of Zn, Ga and In.

It is preferable in the thin-film transistor array in accordance with the above-mentioned embodiments that the oxide-semiconductor film is composed of crystalline oxide containing at least one of Zn, Ga and In.

It is preferable in the thin-film transistor array in accordance with the above-mentioned embodiments that the oxide-semiconductor film is composed of mixed crystal including both amorphous oxide containing at least one of Zn, Ga and In, and polycrystal oxide.

It is preferable in the thin-film transistor array in accordance with the above-mentioned embodiments that the crystalline oxide is formed by crystallizing amorphous oxide with laser irradiation thereto.

It is preferable in the thin-film transistor array in accordance with the above-mentioned embodiments that the oxide-semiconductor film is formed by dissolving powdered oxide semiconductor into solvent, coating or printing the solvent onto an object, and heating the solvent to vaporize the solvent.

For instance, the electrically insulating substrate may be comprised of a resin substrate.

It is preferable in the method of fabricating a thin-film transistor array, in accordance with the above-mentioned embodiments that a part is exposed to the reducing plasma to render a resistivity of the part equal to or greater than $\frac{1}{10}^{10}$, but equal to or smaller than $\frac{1}{10}^{2}$ of a resistivity of the channel in equilibrium state in which no voltage is applied to the channel.

It is preferable in the method of fabricating a thin-film transistor array, in accordance with the above-mentioned embodiments that the reducing plasma is comprised of at least one of rare gas plasma, hydrogen gas plasma and nitrogen gas plasma.

It is preferable in the method of fabricating a thin-film transistor array, in accordance with the above-mentioned embodiments that at least one of B, Al, Ga, In and F is doped into the part to render a resistivity of the part equal to or greater than $\frac{1}{10}^{10}$, but equal to or smaller than $\frac{1}{10}^{2}$ of a resistivity of the channel in equilibrium state in which no voltage is applied to the channel.

It is preferable in the method of fabricating a thin-film transistor array, in accordance with the above-mentioned embodiments that the electrically insulating substrate is comprised of a resin substrate.

The exemplary advantages obtained by the above-mentioned exemplary embodiments are described hereinbelow.

A channel, a source and a drain of a thin-film transistor, a pixel electrode, a source terminal, and a gate terminal are composed of common oxide semiconductor in the above-mentioned embodiments. Accordingly, it would be possible to significantly enhance reliability in electrical connection between a thin-film transistor and an external driver circuit, for instance, through a flexible printed board.

Furthermore, after all of the layer structure in a thin-film transistor array has been formed, an opening is formed in a top layer, that is, a protection insulating film, and then, an oxide-semiconductor film is exposed to reducing plasma or plasma containing doping element(s). As a result, it would be possible to simultaneously reduce resistances in a source terminal, a gate terminal, a source, a drain, and a pixel electrode, ensuring that a thin-film transistor can be fabricated in accordance with a low-cost process without an increase in a number of carrying out a photolithography step.

While the present invention has been described in connection with certain exemplary embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

This application is based upon and claims the benefit of priority from Japanese Patent Application No. 2006-217273 filed on Aug. 9, 2007, the entire disclosure of which, including specification, claims, drawings and summary, is incorporated herein by reference in its entirety.

What is claimed is:

1. A method of fabricating a thin-film transistor array, comprising:
   forming an oxide-semiconductor film;
   patterning said oxide-semiconductor film into a channel, a source and a drain of a thin-film transistor, a pixel electrode, a gate terminal, and a source terminal; and
   exposing at least a part of each of said source, said drain, said pixel electrode, said source terminal, and said gate terminal to one of reducing plasma and plasma containing at least one of B, Al, Ga, In and F for reducing a resistivity of said part.

2. The method as set forth in claim 1, wherein said part is exposed to said reducing plasma to render a resistivity of said part equal to or greater than $\frac{1}{10}^{10}$, but equal to or smaller than $\frac{1}{10}^{2}$ of a resistivity of said channel in equilibrium state in which no voltage is applied to said channel.

3. The method as set forth in claim 1, wherein said reducing plasma is comprised of at least one of rare gas plasma, hydrogen gas plasma and nitrogen gas plasma.

4. A method of fabricating a thin-film transistor array, comprising:
   forming an oxide-semiconductor film;
   patterning said oxide-semiconductor film into a channel, a source and a drain of a thin-film transistor, a pixel electrode, a gate terminal, and a source terminal; and
   doping at least one of B, Al, Ga, In and F into at least a part of each of said source, said drain, said pixel electrode, said source terminal, and said gate terminal for reducing a resistivity of said part.

5. The method as set forth in claim 4, wherein at least one of B, Al, Ga, In and F is doped into said part to render a resistivity of said part equal to or greater than $\frac{1}{10}^{10}$, but equal to or smaller than $\frac{1}{10}^{2}$ of a resistivity of said channel in equilibrium state in which no voltage is applied to said channel.

6. A method of fabricating a thin-film transistor array, comprising, in sequence:
   forming a first electrically conductive film on an electrically insulating substrate;
   patterning said first electrically conductive film into a gate signal line;
   forming a gate insulating film;
   etching for removal a portion of said gate insulating film located above a portion of said gate signal line to thereby form a gate terminal contact hole;
   forming an oxide-semiconductor film;
   patterning said oxide-semiconductor film into a channel, a source and a drain of a thin-film transistor, a pixel electrode, a gate terminal located above said gate terminal contact hole, and a source terminal;
   forming a second electrically conductive film;
   patterning said second electrically conductive film into a source signal line electrically connected to said source terminal;
   forming a protection insulating film;
   etching for removal portions of said protection insulating film located above said gate terminal, said source terminal, said source, said drain, and said pixel electrode to thereby form a gate/source terminal contact hole and an opening; and
   exposing a resultant to one of reducing plasma and plasma containing at least one of B, Al, Ga, In and F.

7. The method as set forth in claim 6, wherein said electrically insulating substrate is comprised of a resin substrate.

8. A method of fabricating a thin-film transistor array, comprising, in sequence:
   forming a first electrically conductive film on an electrically insulating substrate;
   patterning said electrically conductive film into a gate signal line;
   forming a gate insulating film;
   forming a second electrically conductive film;
   patterning said second electrically conductive film into a source signal line;
   etching for removal a portion of said gate insulating film located above a portion of said gate signal line to thereby form a gate terminal contact hole;
   forming an oxide-semiconductor film;
   patterning said oxide-semiconductor film into a channel, a source and a drain of a thin-film transistor, a pixel electrode, a gate terminal located above said gate terminal contact hole, and a source terminal located at an end of said source signal line;
   forming a protection insulating film;
   etching for removal portions of said protection insulating film located above said gate terminal, said source terminal, said source, said drain, and said pixel electrode to thereby form a gate/source terminal contact hole and an opening; and
   exposing a resultant to one of reducing plasma and plasma containing at least one of B, Al, Ga, In and F.

9. The method as set forth in claim 8, wherein said electrically insulating substrate is comprised of a resin substrate.

10. A method of fabricating a thin-film transistor array, comprising, in sequence:
    forming an oxide-semiconductor film on an electrically insulating substrate;
    patterning said oxide-semiconductor film into a channel, a source and a drain of a thin-film transistor, a pixel electrode, a gate terminal, and a source terminal;
    forming a gate insulating film;
    etching for removal a portion of said gate insulating film located above a portion of said gate signal line to thereby form a gate terminal contact hole;
    forming a first electrically conductive film;
    patterning said first electrically conductive film into a gate signal line electrically connected to said gate terminal;
    forming an interlayer insulating film;
    etching for removal portions of said interlayer insulating film and said gate insulating film located said source terminal and said source to thereby form a source terminal contact hole and a source contact hole;
    forming a second electrically conductive film;
    patterning said second electrically conductive film into a source signal line electrically connected to said source terminal and said source;
    forming a protection insulating film;
    etching for removal portions of said gate insulating film, said interlayer insulating film and said gate insulating film located above said gate terminal, said source terminal, said source, said drain and said pixel electrode to thereby form a gate/source terminal contact hole and an opening; and
    exposing a resultant to one of reducing plasma and plasma containing at least one of B, Al, Ga, In and F.

11. The method as set forth in claim 10, wherein said electrically insulating substrate is comprised of a resin substrate.

12. A method of fabricating a thin-film transistor array, comprising, in sequence:
    forming a first electrically conductive film on an electrically insulating substrate;
    patterning said first electrically conductive film into a source signal line;
    forming an oxide-semiconductor film;
    patterning said oxide-semiconductor film into a channel, a source and a drain of a thin-film transistor, a pixel electrode, a gate terminal, and a source terminal;
    forming a gate insulating film;

etching for removal a portion of said gate insulating film located above a portion of said gate signal line to thereby form a gate terminal contact hole;

forming a second electrically conductive film;

patterning said second electrically conductive film into a gate signal line electrically connected to said gate terminal;

forming a protection insulating film;

etching for removal portions of said protection insulating film and said gate insulating film located above said gate terminal, said source terminal, said source, said drain and said pixel electrode to thereby form a gate/source terminal contact hole and an opening; and exposing a resultant to one of reducing plasma and plasma containing at least one of B, Al, Ga, In and F.

13. The method as set forth in claim 12, wherein said electrically insulating substrate is comprised of a resin substrate.

14. A liquid crystal display device including a thin-film transistor array fabricated in accordance with a method defined in claim 1.

15. A liquid crystal display device including a thin-film transistor array fabricated in accordance with a method defined in claim 4.

16. A liquid crystal display device including a thin-film transistor array fabricated in accordance with a method defined in claim 6.

17. A liquid crystal display device including a thin-film transistor array fabricated in accordance with a method defined in claim 8.

18. A liquid crystal display device including a thin-film transistor array fabricated in accordance with a method defined in claim 10.

19. A liquid crystal display device including a thin-film transistor array fabricated in accordance with a method defined in claim 12.

* * * * *